US012666676B2

(12) United States Patent
Maruyama et al.

(10) Patent No.: US 12,666,676 B2
(45) Date of Patent:      Jun. 23, 2026

(54) METHOD OF MANUFACTURING SEMICONDUCTOR DEVICE

(71) Applicant: Renesas Electronics Corporation, Tokyo (JP)

(72) Inventors: Takahiro Maruyama, Tokyo (JP); Toshiya Saito, Tokyo (JP); Takuya Maruyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 414 days.

(21) Appl. No.: 18/515,087

(22) Filed: Nov. 20, 2023

(65) Prior Publication Data

US 2025/0169137 A1      May 22, 2025

(51) Int. Cl.
H10D 64/01          (2025.01)

(52) U.S. Cl.
CPC .................................. H10D 64/01 (2025.01)

(58) Field of Classification Search
CPC .. H10D 64/01; H10D 84/0144; H10D 30/601; H10D 84/0135
See application file for complete search history.

(56)          References Cited

U.S. PATENT DOCUMENTS

| | | | |
|---|---|---|---|
| 2005/0280104 A1* | 12/2005 | Li | ........................ H10D 64/685 257/E21.639 |
| 2006/0131652 A1* | 6/2006 | Li | .................... H10D 64/01342 257/E21.639 |
| 2013/0037890 A1* | 2/2013 | Tseng | .................... H10F 39/014 257/411 |
| 2022/0165743 A1 | 5/2022 | Matsumoto | |

FOREIGN PATENT DOCUMENTS

JP          2022-082242 A          6/2022

* cited by examiner

*Primary Examiner* — Douglas M Menz
(74) *Attorney, Agent, or Firm* — Rimon P.C.

(57)          ABSTRACT

A first conductive pattern is formed on a semiconductor substrate and formed from a first conductive film. A second conductive film having a first portion on the semiconductor substrate, a second portion on an upper surface of the first conductive pattern, and a third portion connecting the first portion and the second portion so as to cover a side surface of the first conductive pattern, is formed. The upper surface of the third portion is higher than the upper surface of the first portion. The second portion is patterned. The second portion and a part of the third portion are selectively removed. By patterning the first conductive pattern and the second conductive film, a first gate electrode is formed from a part of the first conductive pattern, and a second gate electrode is formed from a part of the first portion.

20 Claims, 28 Drawing Sheets

METHOD OF MANUFACTURING SEMICONDUCTOR DEVICE

BACKGROUND

The present invention relates to a manufacturing method of a semiconductor device, particularly to a manufacturing method of a semiconductor device including a plurality of gate electrodes formed from different conductive films.

In recent years, with the miniaturization of MOSFET (Metal Oxide Semiconductor Field Effect Transistor), it has been considered to use a high dielectric constant film, known as a High-k film, to improve the silicon oxide conversion film thickness of the gate dielectric film.

There are disclosed techniques listed below.

[Patent Document 1] Japanese Unexamined Patent Application Publication No. 2022-082242

For example, Patent Document 1 discloses a MOSFET having a gate dielectric film to which hafnium (Hf) is added. By adding hafnium to the gate dielectric film, a MOSFET (low-leakage MOSFET) that can control the leakage current low can be formed. Also, on the same semiconductor substrate, a MOSFET (high-speed MOSFET) having a gate dielectric film to which hafnium is not added is also formed. This high-speed MOSFET is used in circuits that operate faster than the low-leakage MOSFET.

In Patent Document 1, after forming a first gate dielectric film of a high-speed MOSFET and a first conductive film for a first gate electrode, the first gate dielectric film and the first conductive film formed in a region for a low-leak MOSFET are removed by patterning. Next, a second gate dielectric film of a low-leak MOSFET and a second conductive film for a second gate electrode are formed in the region for the low-leak MOSFET. The second gate dielectric film and the second conductive film are also formed on the first conductive film. Next, by patterning, a second gate electrode is formed from the second conductive film, and the second conductive film located on the first conductive film is removed. Next, by patterning, a first gate electrode is formed from the first conductive film.

SUMMARY

In the patterning of gate electrodes, precise dimensional control is required. However, as the number of patterning increases, the number of masks increases, leading to an increase in manufacturing costs. If the patterning of the first gate electrode of the high-speed MOSFET and the second gate electrode of the low-leak MOSFET can be performed simultaneously, the number of masks can be reduced. However, to do so, it is necessary to align the height of the first conductive film and the height of the second conductive film before patterning.

As described above, the second conductive film is also formed on the first conductive film, and the thickness of each of the second conductive film and the first conductive film is about 100 nm, and a step of about 100 nm is generated between the region for low-leak MOSFET and the region for high-speed MOSFET. This step needs to be eliminated, and it is necessary to flatten the upper surface of the first conductive film and the upper surface of the second conductive film. If the planar area or width of the second conductive film located in the region for the low-leak MOSFET is large, for example, it is conceivable to remove the second conductive film located on the first conductive film simply by polishing treatment using the CMP (Chemical Mechanical Polishing) method. However, in that case, the second conductive film located in the region for the low-leak MOSFET is also polished, and there is a risk that a part of the second conductive film may disappear.

Therefore, it is desirable to provide a manufacturing method of a reliable semiconductor device by aligning the height of the first conductive film and the height of the second conductive film while suppressing the disappearance of a part of the second conductive film. Other purpose and novel features will become apparent from the description of this specification and the accompanying drawings.

The typical ones of the embodiments disclosed in the present application will be briefly described as follows.

According to one embodiment, a method of manufacturing a semiconductor device includes a step of forming a first conductive film on a semiconductor substrate, a step of forming a first conductive pattern by patterning the first conductive film, a step of forming a second conductive film having a first portion on the semiconductor substrate, a second portion on the upper surface of the first conductive pattern, and a third portion of which an upper surface is higher than the upper surface of the first portion, connecting the first portion and the second portion so as to cover the side surface of the first conductive pattern, a step of patterning the second portion, a step of selectively removing the second portion and a part of the third portion, and a step of forming a first gate electrode from a part of the first conductive pattern and a second gate electrode from a part of the first portion by patterning the first conductive pattern and the second conductive film.

BRIEF DESCRIPTION OF THE DRAWINGS

FIG. 2 is a cross-sectional view showing a manufacturing process of the semiconductor device following FIG. 1.

FIG. 3 is a cross-sectional view showing a manufacturing process of the semiconductor device following FIG. 2.

FIG. 5 is a cross-sectional view showing a manufacturing process of the semiconductor device following FIG. 4.

FIG. 8 is a plan view showing the semiconductor device at the end of the manufacturing process of FIG. 6.

FIG. 9 is a cross-sectional view showing a manufacturing process of the semiconductor device following FIG. 7.

FIG. 11 is a cross-sectional view showing a manufacturing process of the semiconductor device following FIG. 10.

FIG. 12 is a cross-sectional view showing a manufacturing process of a semiconductor device in a second embodiment.

FIG. 15 is a cross-sectional view showing a manufacturing process of the semiconductor device following FIG. 14.

FIG. 16 is a cross-sectional view showing a manufacturing process of the semiconductor device following FIG. 15.

FIG. 17 is a cross-sectional view showing a manufacturing process of a semiconductor device in a first modified example of the third embodiment.

FIG. 20 is a cross-sectional view showing a manufacturing process of the semiconductor device following FIG. 19.

FIG. 21 is a cross-sectional view showing a manufacturing process of the semiconductor device following FIG. 20.

FIG. 22 is a cross-sectional view showing the manufacturing process of the semiconductor device following FIG. 21.

FIG. 25 is a cross-sectional view showing a manufacturing process of the semiconductor device following FIG. 24.

DETAILED DESCRIPTION

Figure 1:
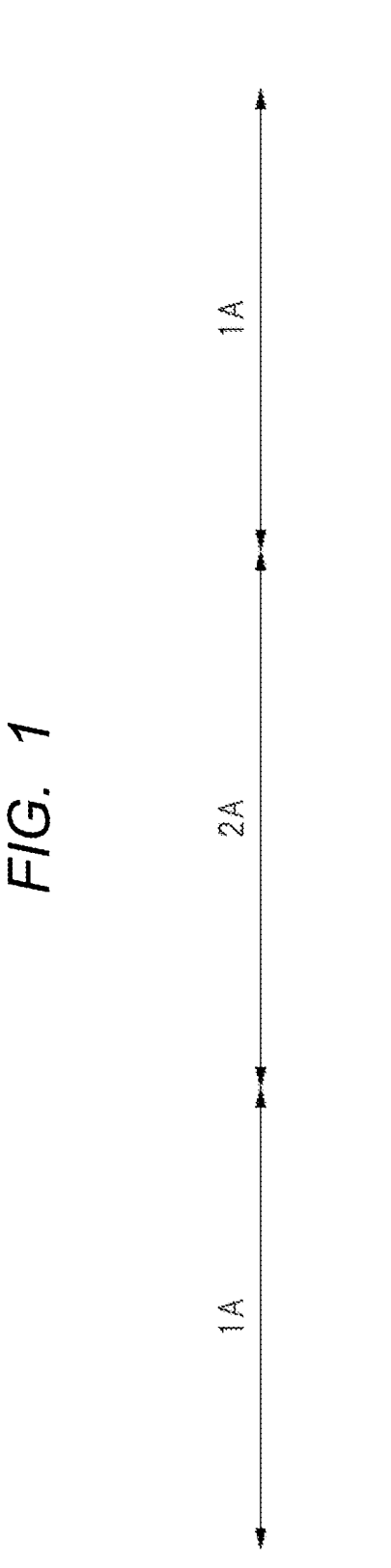
FIG. 1 is a cross-sectional view showing a manufacturing process of a semiconductor device in a first embodiment.
Figure 1:
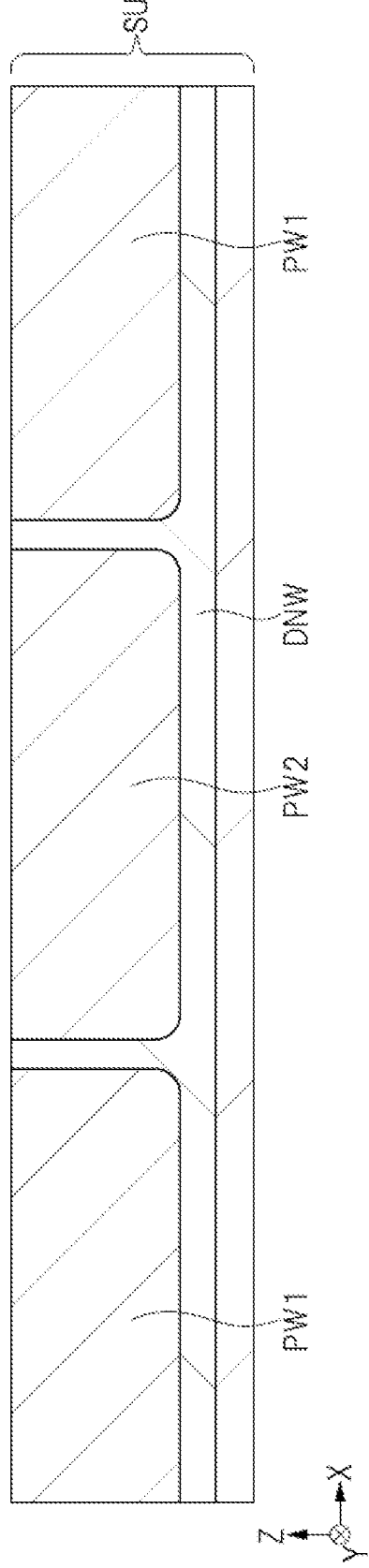

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X-direction, the Y-direction, and the Z-direction described in the present application intersect each other and are orthogonal to each other. In the present application, the Z-direction is described as a vertical direction, depth, direction, a height direction a height direction, or a thickness direction of a certain structure. In addition, the expression "plan view" used in the present application means that the plane formed by the X-direction and the Y-direction is a "plane" and the "plane" is viewed from the Z-direction.

First Embodiment

The manufacturing method of the semiconductor device in the first embodiment will be described below with reference to FIGS. 1 to 11.

As shown in the drawings after FIG. 1, the semiconductor device in the first embodiment includes the region 1A and the region 2A. The region 1A includes the n-type MOSFET 1Q. The region 2A includes the n-type MOSFET 2Q that differs from the MOSFET 1Q.

As shown in FIG. 1, first, the semiconductor substrate SUB is prepared. The semiconductor substrate SUB is made of, for example, monocrystalline silicon into which p-type impurities are introduced. Next, the well region DNW which is an n-type impurity region is formed in the semiconductor substrate SUB by a photolithography technique and an ion-implantation method. Next, by a photolithography technique and an ion-implantation method, the well region PW1 which is a p-type impurity region is formed in the well region DNW in the region 1A and the well region PW2 which is a p-type impurity region is formed in the well region DNW in the region 2A.

Figure 2:
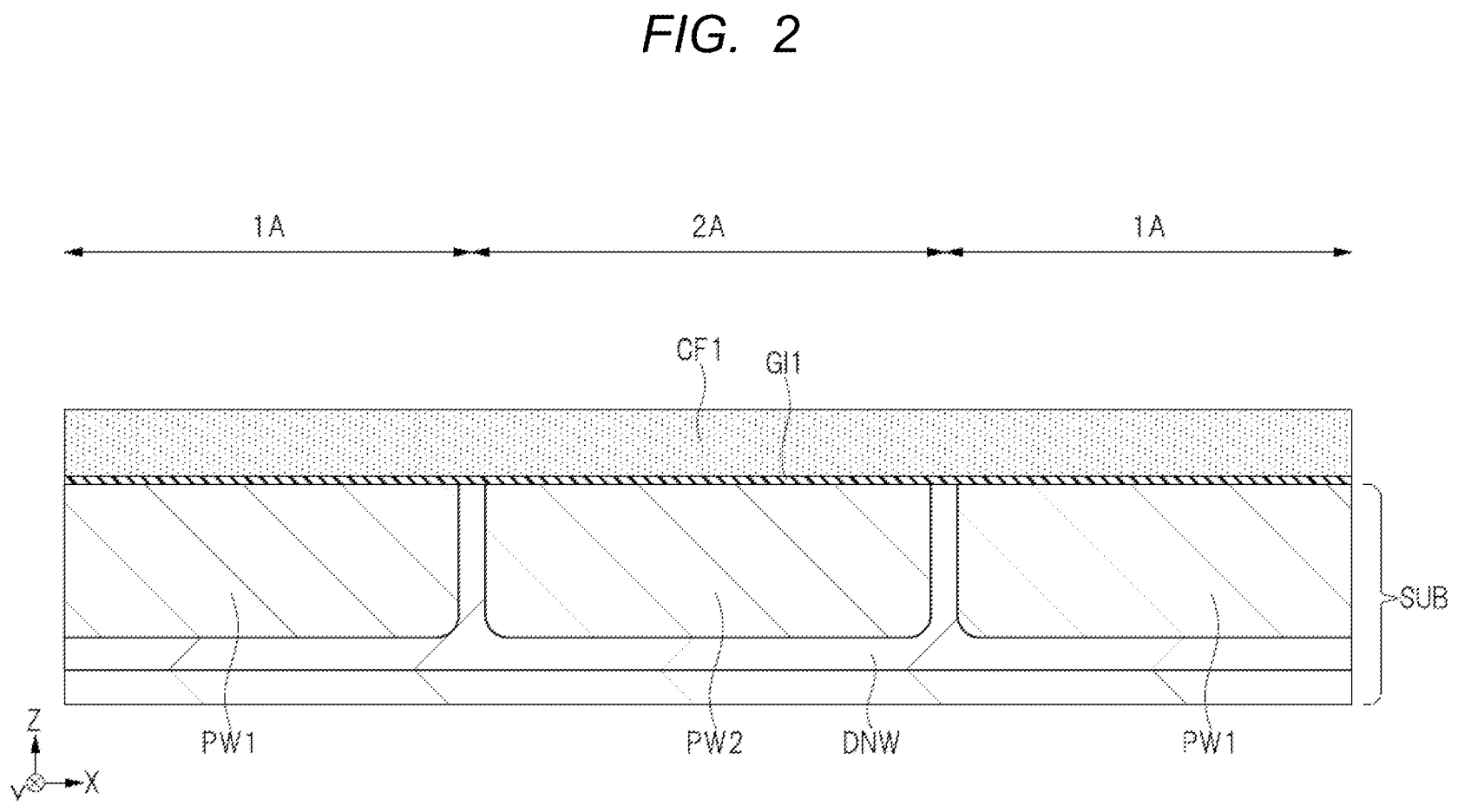

As shown in FIG. 2, the gate dielectric film GI1 and the conductive film CF1 are sequentially formed on the semiconductor substrate SUB. First, the gate dielectric film GI1 is formed on the semiconductor substrate SUB by, for example, a thermal oxidation treatment. The gate dielectric film GI1 includes, for example, a silicon oxide film. The thickness of the gate dielectric film GI1 is, for example, 2 nm or more and 6 nm or less.

Next, the conductive film CF1 is formed on the gate dielectric film GI1 by a film formation treatment using, for example, a CVD (Chemical Vapor Deposition) method. The conductive film CF1 includes, for example, a polysilicon film. The thickness of the conductive film CF1 is, for example, 80 nm or more and 120 nm or less. The number of times the film formation treatment is performed to form the conductive film CF1 may be one or more than two times.

Figure 3:
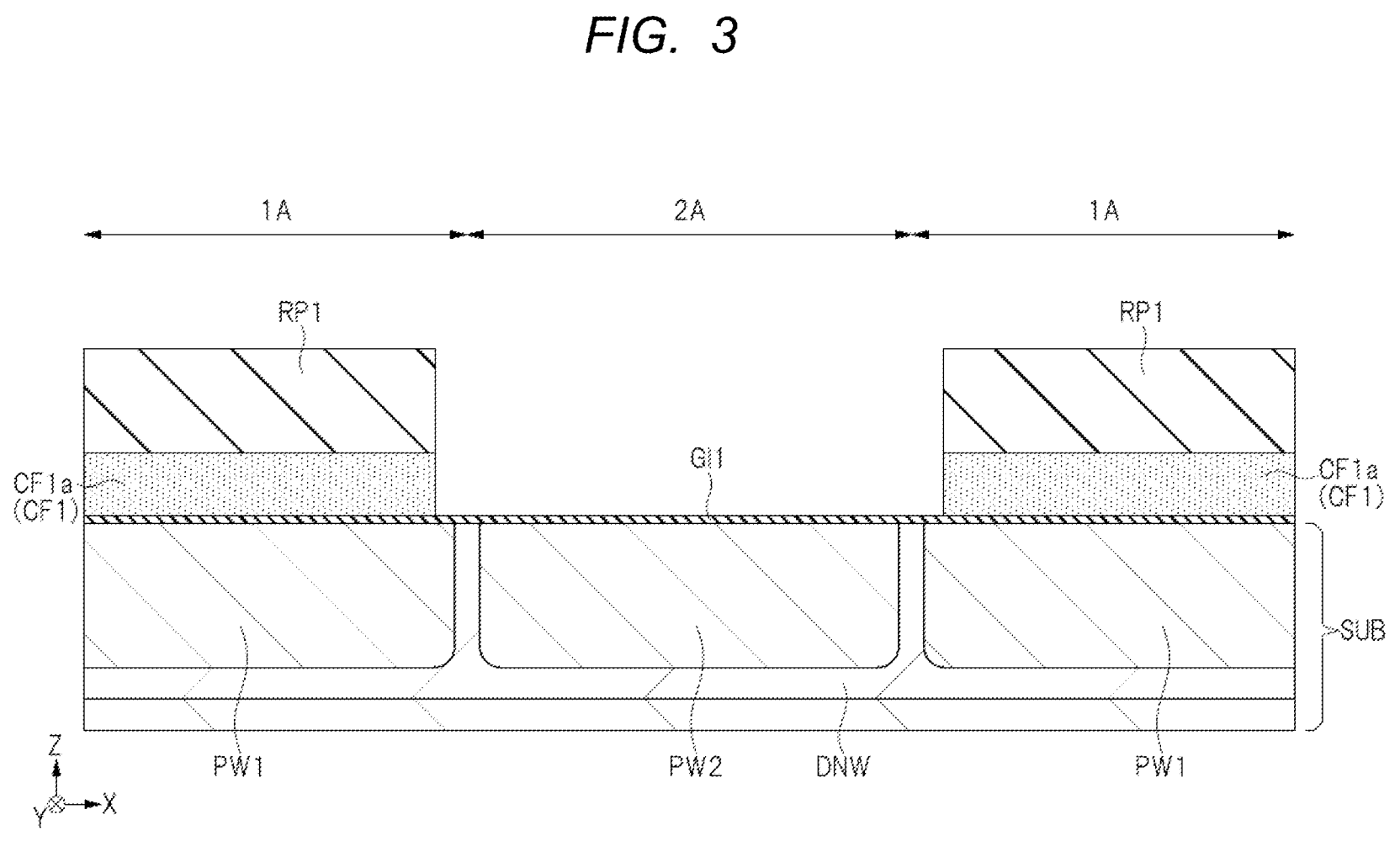

As shown in FIG. 3, the conductive film CF1 is patterned to form the conductive pattern CF1a. First, the resist pattern RP1 is formed on the conductive film CF1. The resist pattern RP1 has a pattern for opening the conductive film CF1 located in the region 2A. Next, an anisotropic etching treatment is performed using the resist pattern RP1 as a mask to selectively remove the conductive film CF1 exposed from the resist pattern RP1. The remaining conductive film CF1 is formed as the conductive pattern CF1a. In addition, the gate dielectric film GI1 located in the region 2A is exposed. Thereafter, the resist pattern RP1 is removed by an ashing treatment.

Figure 4:
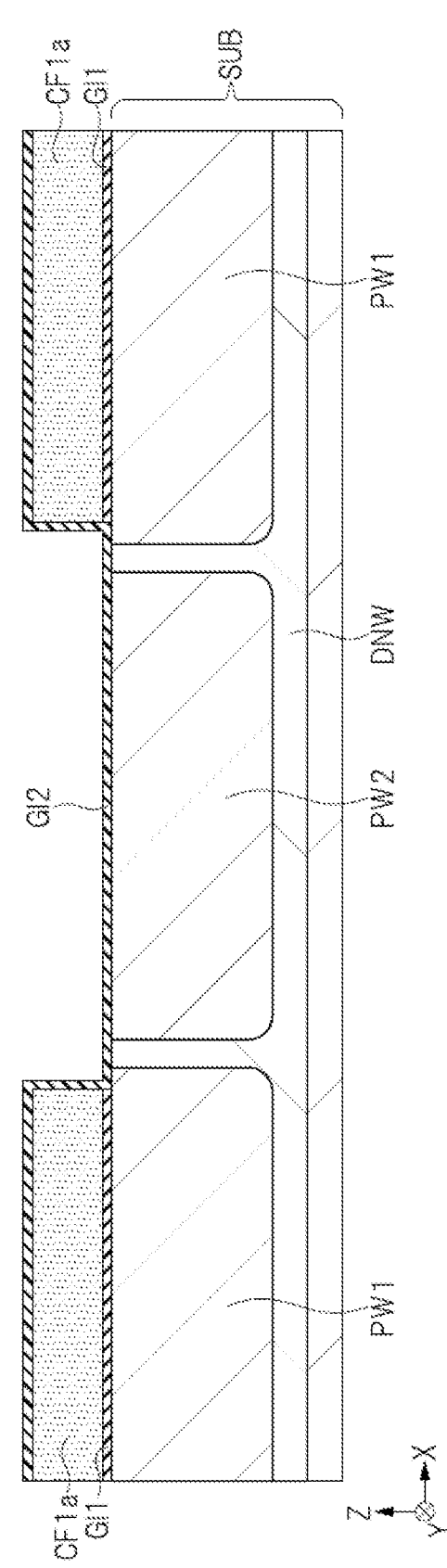
FIG. 4 is a cross-sectional view showing a manufacturing process of the semiconductor device following FIG. 3.

As shown in FIG. 4, first, the gate dielectric film GI1 exposed from the conductive pattern CF1a is removed by an isotropic etching treatment. In this isotropic etching treatment, for example, an aqueous solution containing hydrofluoric acid is used. Next, the gate dielectric film GI2 is formed on the semiconductor substrate SUB, on the side surface of the conductive pattern CF1a, and on the upper surface of the conductive pattern CF1a. The gate dielectric film GI2 includes a high dielectric constant film having a dielectric constant higher than a dielectric constant of the silicon nitride film. The thickness of the gate dielectric film GI2 is, for example, 2 nm or more and 6 nm or less.

An exemplary manufacturing process of the gate dielectric film GI2 will be described below. First, a silicon oxide film is formed on the semiconductor substrate SUB, on the side surface of the conductive pattern CF1a, and on the upper surface of the conductive pattern CF1a by, for example, a thermal oxidation treatment. Next, a metal film is formed on the silicon oxide film by, for example, an ALD (Atomic Layer Deposition) method. Next, for example, a heat treatment of 700 degrees Celsius is performed to cause the silicon oxide film and the metal film to react with each other.

The metal film is, for example, a hafnium (Hf) film. By reacting the silicon oxide film with the metal film, a silicon oxide film to which Hf is added is formed. The high dielectric constant film included in the gate dielectric film GI2 may be a dielectric film to which a metal other than Hf is added. Metals other than Hf are, for example, tantalum (Ta) or zirconium (Zr). The gate dielectric film GI2 may be formed by a film formation treatment using the CVD method or the ALD method other than the thermal oxidation treatment.

Figure 5:
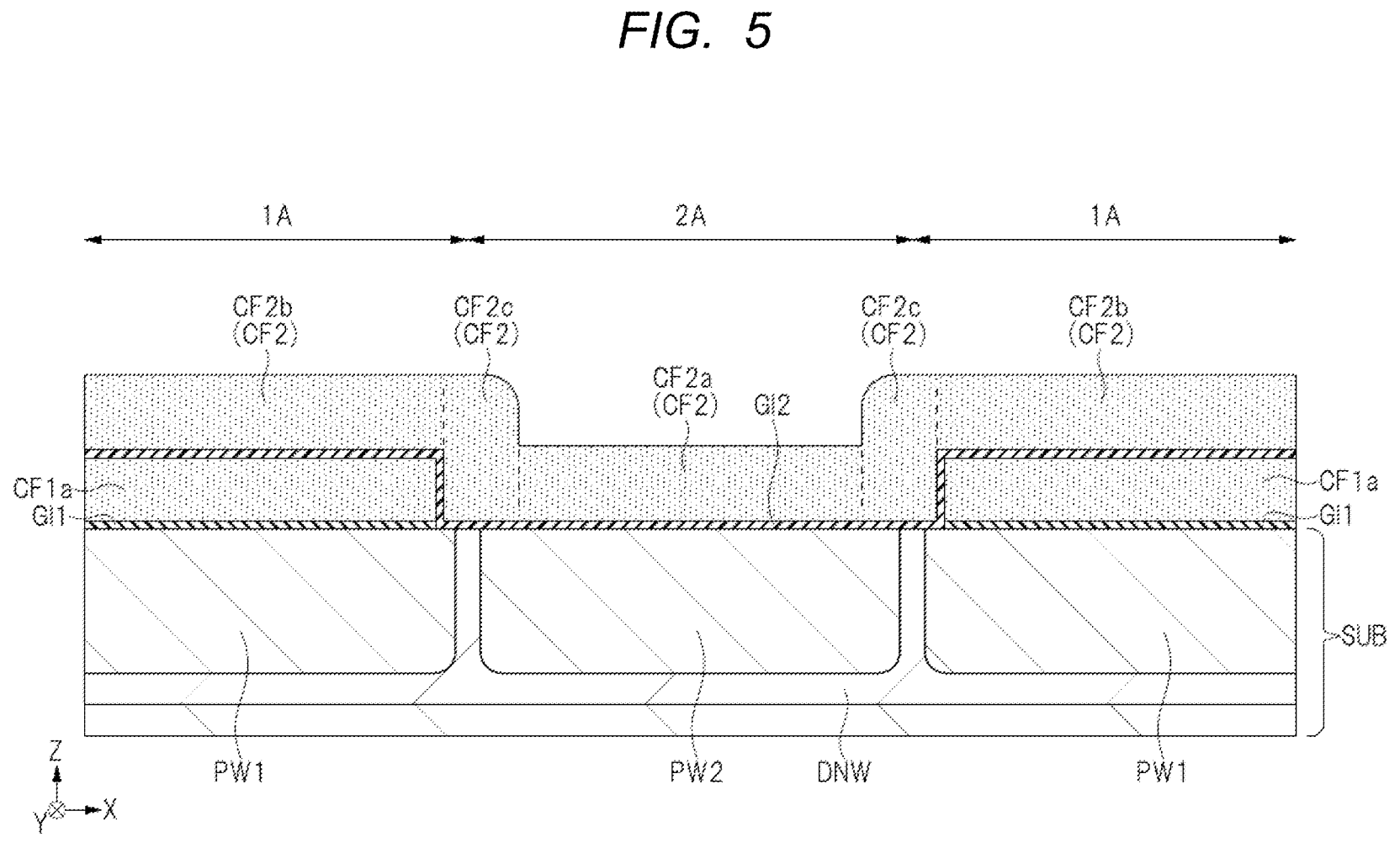

As shown in FIG. 5, the conductive film CF2 is formed on the gate dielectric film GI2 by a film formation treatment using, for example, the CVD method. The conductive film CF2 includes, for example, a polysilicon film. The thickness of the conductive film CF2 is, for example, 80 nm or more and 120 nm or less. The number of times the film formation treatment is performed to form the conductive film CF2 may be one or more than two times.

The conductive film CF2 includes: the first portion CF2*a* located on the semiconductor substrate SUB; the second portion CF2*b* located on the upper surface of the conductive pattern CF1*a*; and the third portion CF2*c* connecting the first portion CF2*a* and the second portion CF2*b* so as to cover the side surface of the conductive pattern CF1*a*. The upper surface of the second portion CF2*b* and the upper surface of the third portion CF2*c* is higher than the upper surface of the first portion CF2*a*. That is, a step is generated between the upper surface of the second portion CF2*b* and the upper surface of the first portion CF2*a*. The height difference of the step is, for example, 80 nm or more and 120 nm or less.

First Examined Example

Figure 26:
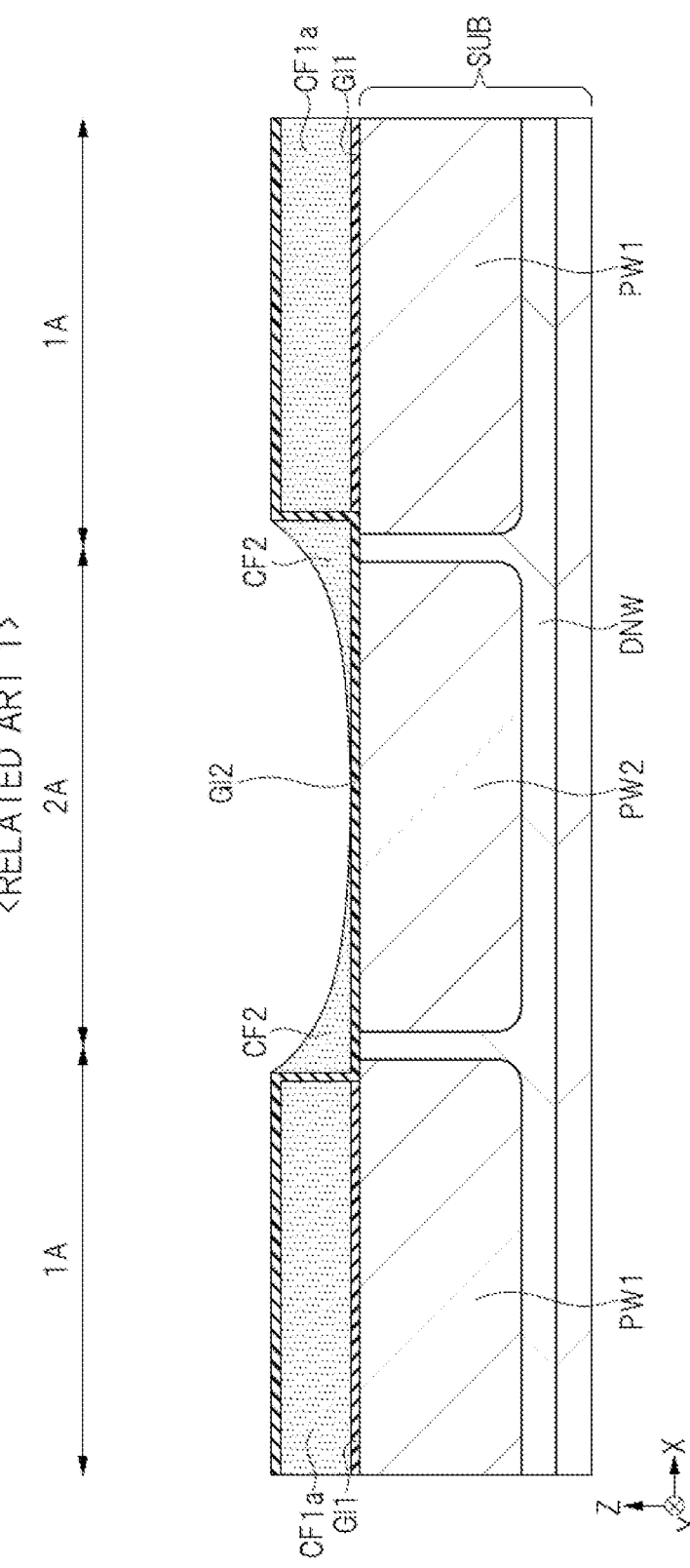
FIG. 26 is a cross-sectional view showing a manufacturing process of a semiconductor device in a first examined example.

FIG. 26 shows the manufacturing method of the semiconductor device of the first examined example studied by the present inventors. In FIG. 26, after the manufacturing process of the conductive film CF2 of FIG. 5, in order to align the height of the conductive pattern CF1*a* and the height of the conductive film CF2, the second portion CF2*b* and the third portion CF2*c* are polished by the CMP method. At this time, in the X-direction, the first portion CF2*a* may be as large as 10 μm or more. The present inventors have found that the polishing cloth used in the polishing treatment may contact the first portion CF2*a* and a part of the first portion CF2*a* may disappear.

Figure 6:
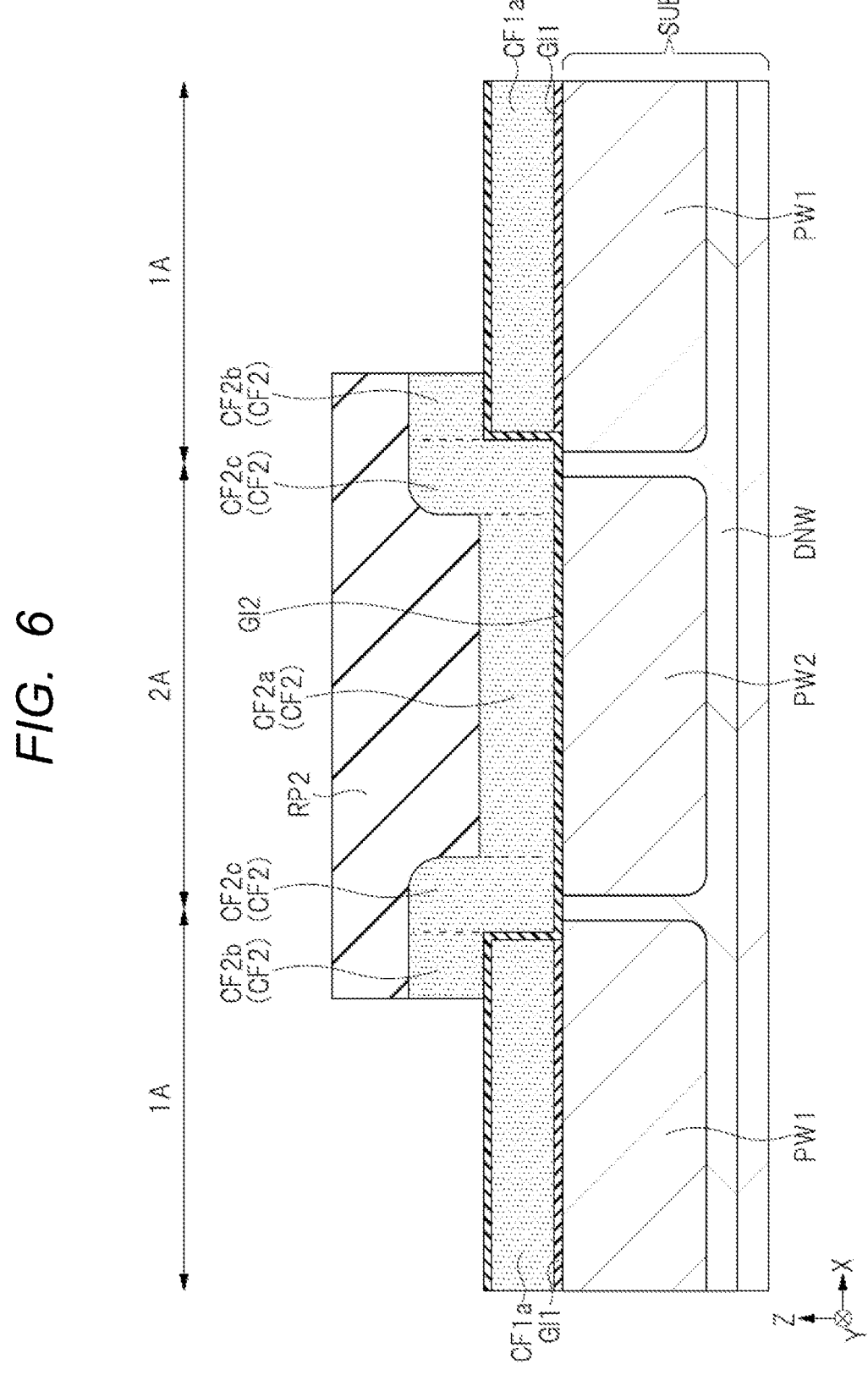
FIG. 6 is a cross-sectional view showing a manufacturing process of the semiconductor device following FIG. 5.

As shown in FIG. 6, in the first embodiment, in order to solve the problem in the first examined example, the second portion CF2*b* is patterned so that the first portion CF2*a*, the third portion CF2*c*, and a part of the second portion CF2*b* connected to the third portion CF2*c* are left. As a result, the width of the second portion CF2*b* in the X-direction decreases.

First, the resist pattern RP2 is formed on the conductive film CF2. The resist pattern RP2 selectively covers the first portion CF2*a*, the third portion CF2*c*, and the part of the second portion CF2*b* connected to the third portion CF2*c*, and opens the other part of the second portion CF2*b*. Next, an anisotropic etching treatment is performed using the resist pattern RP2 as a mask to selectively remove the second portion CF2*b* exposed from the resist pattern RP2. Thereafter, the resist pattern RP2 is removed by an ashing treatment.

Figure 7:
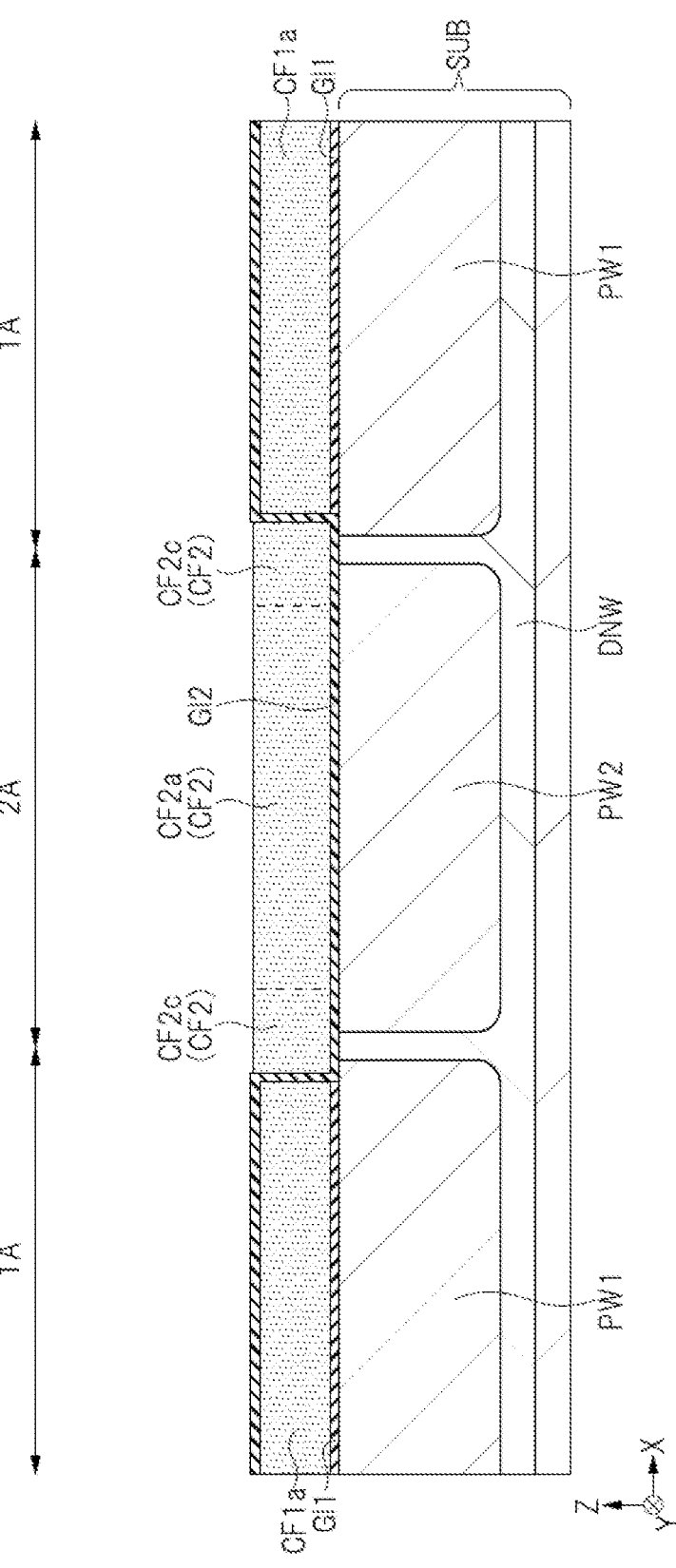
FIG. 7 is a cross-sectional view showing a manufacturing process of the semiconductor device following FIG. 6.

As shown in FIG. 7, after the second portion CF2*b* is patterned, the second portion CF2*b* and the third portion CF2*c* are polished by the CMP method. Thus, a part of the third portion CF2*c* formed at a location higher than the upper surface of the first portion CF2*a* and the second portion CF2*b* are selectively removed. In the first embodiment, since the polishing amount of the conductive film CF2 to be polished is smaller than the polishing amount of the conductive film CF2 in the first examined example, the time required for the polishing treatment is shorter than the time required for the polishing treatment in the first examined example. For example, a part of the third portion CF2*c* and the second portion CF2*b* may be removed by the polishing treatment of 5 seconds to 15 seconds.

Therefore, even if the polishing cloth contacts the first portion CF2*a*, the contact time is shorter than the contact time in the first examined example. Therefore, it is possible to align the height of the conductive film CF1 (conductive pattern CF1*a*) and the height of the conductive film CF2 while suppressing the problem of the first examined example in which a part of the first portion CF2*a* disappears. That is, the first embodiment can provide the manufacturing method of a highly reliable semiconductor device.

Figure 8:
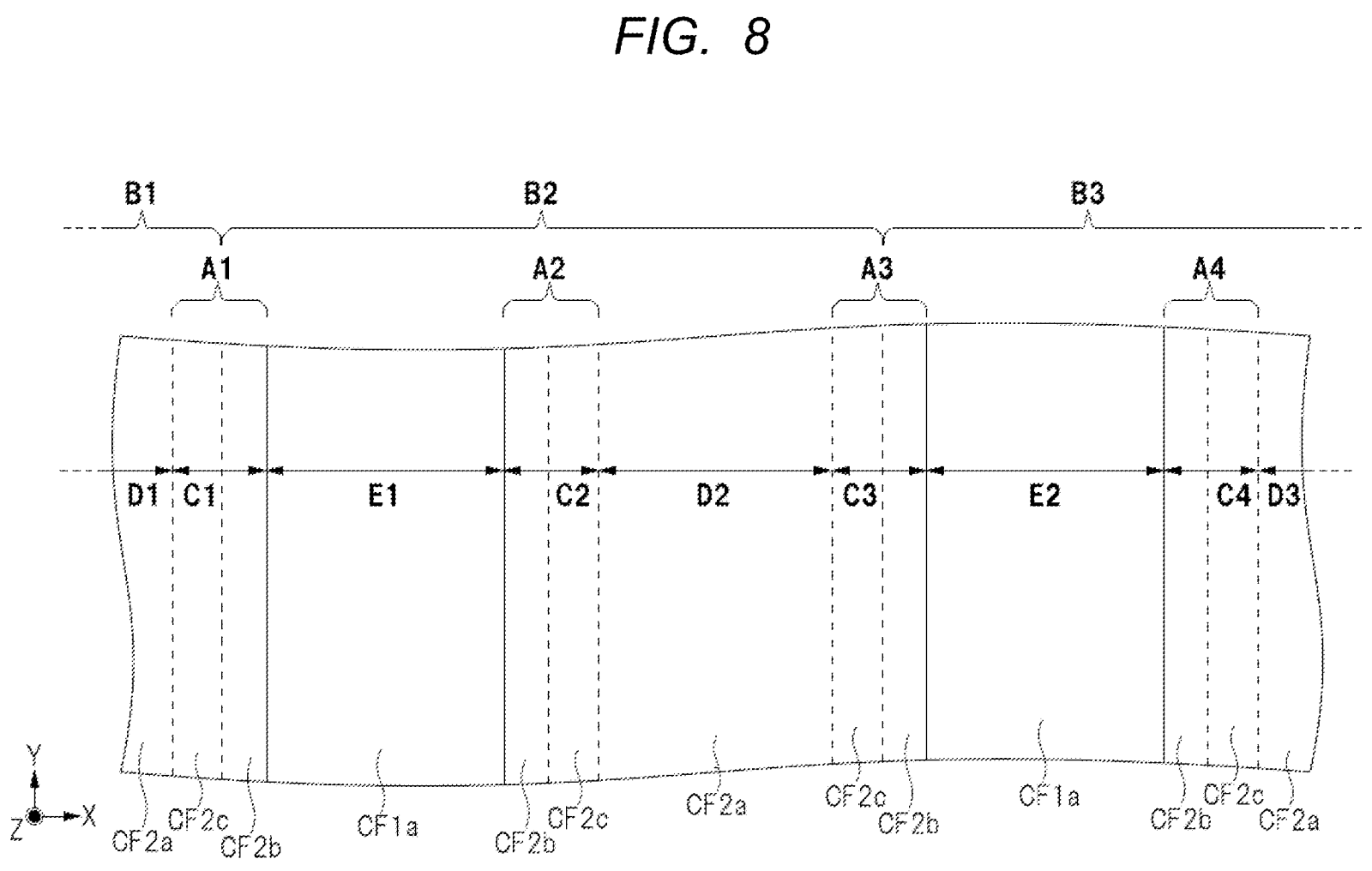

With reference to FIG. 8, an exemplary configuration in which the polishing treatment of FIG. 7 can be satisfactorily performed without causing a problem such as the first examined example will be described.

FIG. 8 is a plan view at the end of the manufacturing process of FIG. 6, and shows a wider region than the region shown in FIGS. 1 to 7. In the manufacturing process of FIG. 3, the plurality of conductive patterns CF1*a* are formed on the semiconductor substrate SUB. In the manufacturing process of FIG. 5, the conductive film CF2 is formed so as to cover the plurality of conductive patterns CF1*a*. In the manufacturing process of FIG. 6, the plurality of first portions CF2*a*, the plurality of second portions CF2*b*, and the plurality of third portions CF2*c* are formed.

The first requirement utilizes a planar area of each of the plurality of conductive patterns CF1*a*, the plurality of first portions CF2*a*, the plurality of second portions CF2*b*, and the plurality of third portions CF2*c*. The first requirement is that, at the end of the manufacturing process in FIG. 6, the sum (ΣAn) of the planar area of the plurality of second portions CF2*b* and the planar area of the plurality of third portions CF2*c* is less than 50% of the sum (ΣBn) of the planar area of the plurality of conductive patterns CF1*a*, the planar area of the plurality of first portions CF2*a*, and the planar area of the plurality of third portions CF2*c*. Note that "n" is an integral number.

The second requirement is that, in the direction (X-direction) perpendicular to the side surface of the conductive pattern CF1*a*, the sum Cn of the width of the second portion CF2*b* and the width of the third portion CF2*c* is less than 2 μm. It is preferable that these requirements are satisfied simultaneously. Thus, the polishing treatment of FIG. 7 can be satisfactorily performed. In the first embodiment, the width of the first portion CF2*a* is 10 μm or more in the X-direction.

Figure 9:
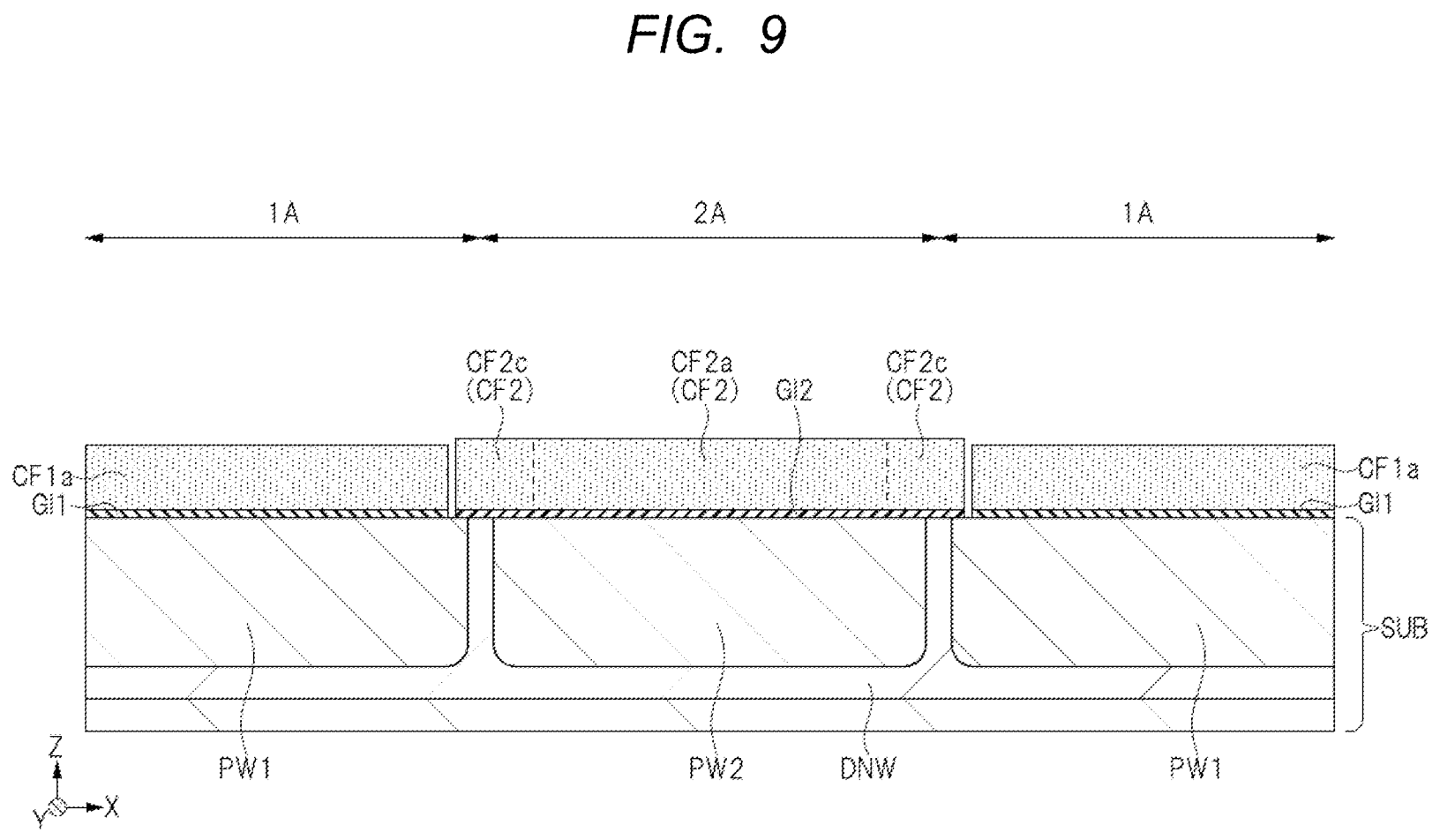

As shown in FIG. 9, the gate dielectric film GI2 located on the side surface of the conductive pattern CF1*a* and on the upper surface of the conductive pattern CF1*a* are removed by the isotropic etching treatment. In this isotropic etching treatment, for example, an aqueous solution containing hydrofluoric acid is used. Thereafter, although not shown, n-type impurities are introduced into the conductive pattern CF1*a* and the conductive film CF2 by the photolithography technique and the ion-implantation method.

Figure 10:
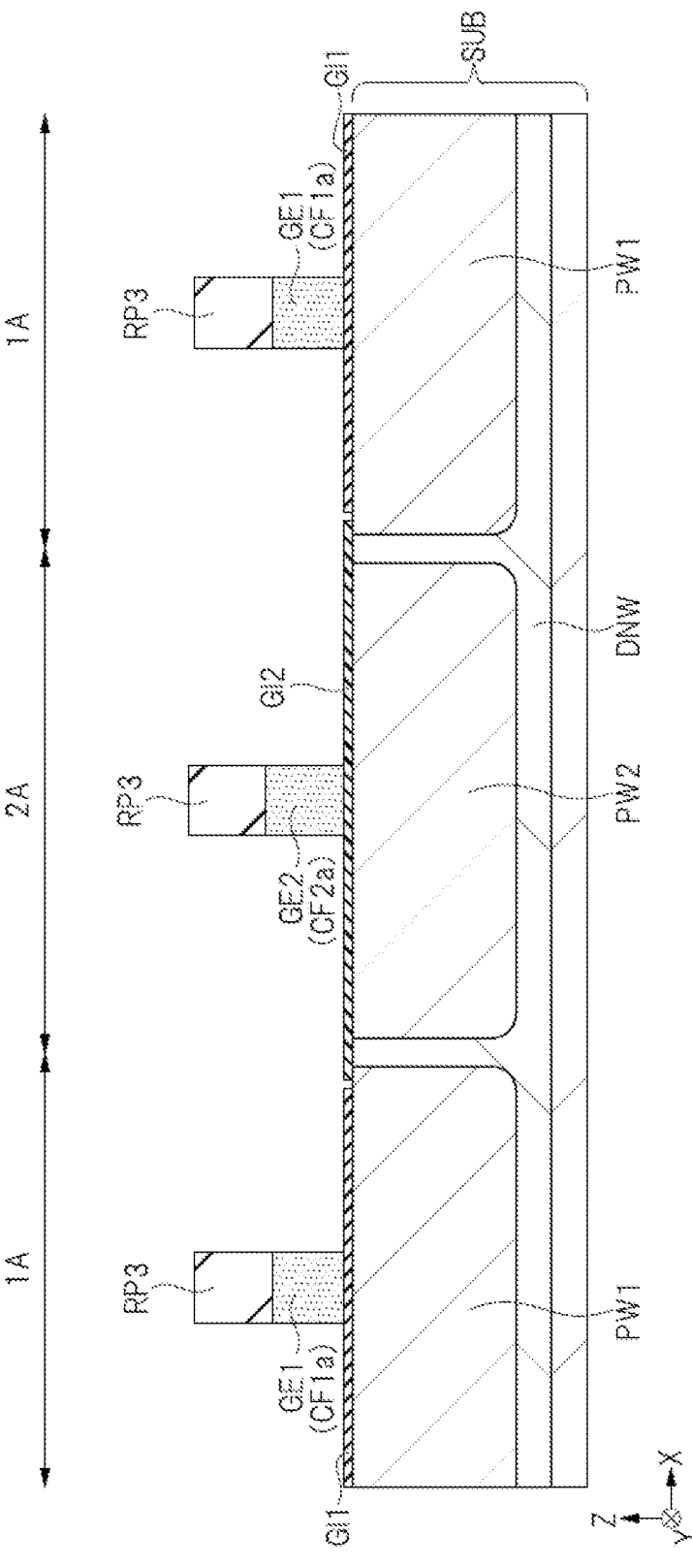
FIG. 10 is a cross-sectional view showing a manufacturing process of the semiconductor device following FIG. 9.

As shown in FIG. 10, by patterning the conductive pattern CF1*a* and the conductive film CF2, the gate electrode GE1 is formed from a part of the conductive pattern CF1*a*, and the gate electrode GE2 is formed from a part of the first portion CF2*a*.

First, the resist pattern RP3 is formed on the conductive pattern CF1*a* and the conductive film CF2. The resist pattern RP3 selectively covers a part of the conductive pattern CF1*a* and a part of the first portion CF2*a*, and opens the other part of the conductive pattern CF1*a*, the third portion CF2*c*, and the other part of the first portion CF2*a*. Next, an anisotropic etching treatment is performed using the resist pattern RP3 as a mask to selectively remove the conductive pattern CF1a, the third portion CF2c, and the first portion CF2a exposed from the resist pattern RP3. The remaining conductive pattern CF1a is formed as the gate electrode GE1, and the remaining first portion CF2a is formed as the gate electrode GE2. Thereafter, the resist pattern RP3 is removed by an ashing treatment.

Here, two gate electrodes GE1 are formed in the region 1A, and one gate electrode GE2 is formed in the region 2A. By changing the opening pattern of the resist pattern RP3, the plurality of gate electrodes GE1 and the plurality of gate electrodes GE2 can be formed in the region 1A and the region 2A.

Figure 11:
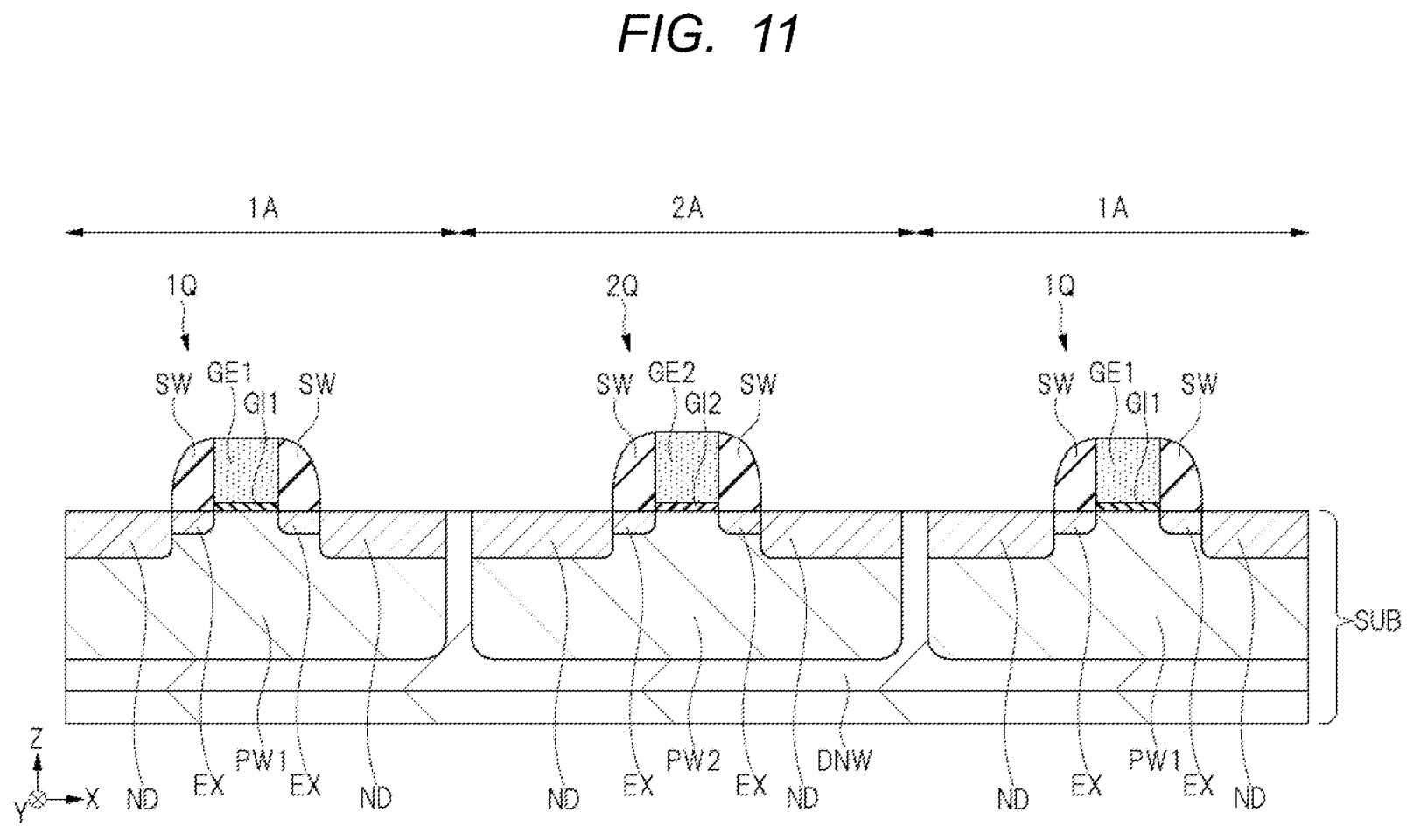

As shown in FIG. 11, by forming the extension region EX, the sidewall spacer SW, and the diffusion region ND, the MOSFET 1Q is formed in the region 1A, and the MOSFET 2Q is formed in the region 2A.

First, the gate dielectric film GI1 exposed from the gate electrode GE1 and the gate dielectric film GI2 exposed from the gate electrode GE2 are removed by the isotropic etching treatment. In this isotropic etching treatment, for example, an aqueous solution containing hydrofluoric acid is used. Next, the extension region EX, which is an n-type impurity region, is formed in the well region PW1 exposed from the gate electrode GE1 and in the well region PW2 exposed from the gate electrode GE2 by the photolithography technique and the ion-implantation method.

Next, for example, a silicon oxide film and a silicon nitride film are sequentially formed by a film formation treatment using, for example, a CVD method so as to cover the gate electrode GE1 and the gate electrode GE2. Next, the silicon oxide film and the silicon nitride film are processed by the anisotropic etching treatment. Accordingly, the sidewall spacer SW including a stacked film of the silicon oxide film and the silicon nitride film is formed on each side surface of the gate electrode GE1 and the gate electrode GE2.

Next, the diffusion region ND, which is an n-type impurity region, is formed in the well region PW1 exposed from the sidewall spacer SW and in the well region PW2 exposed from the sidewall spacer SW by the photolithography technique and the ion-implantation method. The diffusion region ND has an impurity concentration higher than an impurity concentration of the extension region EX.

After the gate dielectric film GI2 is removed in FIG. 9, n-type impurities are ion-implanted into the conductive pattern CF1a and the conductive film CF2. The ion implantation may be omitted, and n-type impurities may be introduced into the gate electrode GE1 and the gate electrode GE2 by ion implantation of the diffusion region ND. Thus, the manufacturing process can be simplified.

The MOSFET 1Q includes the gate dielectric film GI1, the gate electrode GE1, the well region PW1, the sidewall spacer SW, the extension region EX, and the diffusion region ND. The extension region EX and the diffusion region ND in the well region PW1 function as the source region and the drain region of the MOSFET 1Q.

The MOSFET 2Q includes the gate dielectric film GI2, the gate electrode GE2, the well region PW2, the sidewall spacer SW, the extension region EX, and the diffusion region ND. The extension region EX and the diffusion region ND in the well region PW2 function as the source region and the drain region of the MOSFET 2Q.

The thicknesses of the gate dielectric film GI1 and the gate dielectric film GI2 are approximately the same, and the MOSFET 1Q and the MOSFET 2Q are driven at the same operating voltage. However, since the gate dielectric film GI2 includes the high dielectric constant film, the silicon oxide conversion film thickness of the gate dielectric film GI2 is greater than the silicon oxide conversion film thickness of the gate dielectric film GI1.

Therefore, the MOSFET 2Q can control the leakage current to be lower. On the other hand, the MOSFET 1Q is used in circuits that operate at a higher speed than the MOSFET 2Q. The MOSFET 2Q is used, for example, in a power supply circuit or an SRAM. The MOSFET 1Q is used, for example, in a CPU. Alternatively, the MOSFET 1Q is used in an SRAM that operates at a higher speed than the SRAM in which the MOSFET 2Q is used.

In the first embodiment, although the n-type MOSFET 1Q is exemplified as a MOSFET formed in the region 1A, the MOSFET formed in the region 1A may be a p-type MOSFET. In such case, the conductivity type of the well region PW1 in the region 1A is n-type, and the conductivity type of the gate electrode GE1, the extension region EX, and the diffusion region ND is p-type.

Also, the MOSFET formed in the region 1A may be a high withstand voltage MOSFET used in an I/O circuit. In such case, the gate dielectric film GI1 is formed such that the thickness of the gate dielectric film GI2 is greater than the silicon oxide conversion film thickness of the gate dielectric film GI2.

As described above, even if the MOSFET formed in the region 1A is a MOSFET other than the n-type MOSFET 1Q, when two types of gate electrodes are formed from the conductive film CF1 and the conductive film CF2, the technique of the first embodiment can be effectively used.

Second Embodiment

The manufacturing method of the semiconductor device in the second embodiment will be described below with reference to FIG. 12 and FIG. 13. Note that in the following description, differences from the first embodiment will be mainly described, and description of the overlapping points with the first embodiment will be omitted.

In the first embodiment, the polishing treatment using the CMP method is used to remove the second portion CF2b and a part of the third portion CF2c. In the second embodiment, a non-selective anisotropic etching treatment, and the coating film SOG1 are used.

Figure 12:
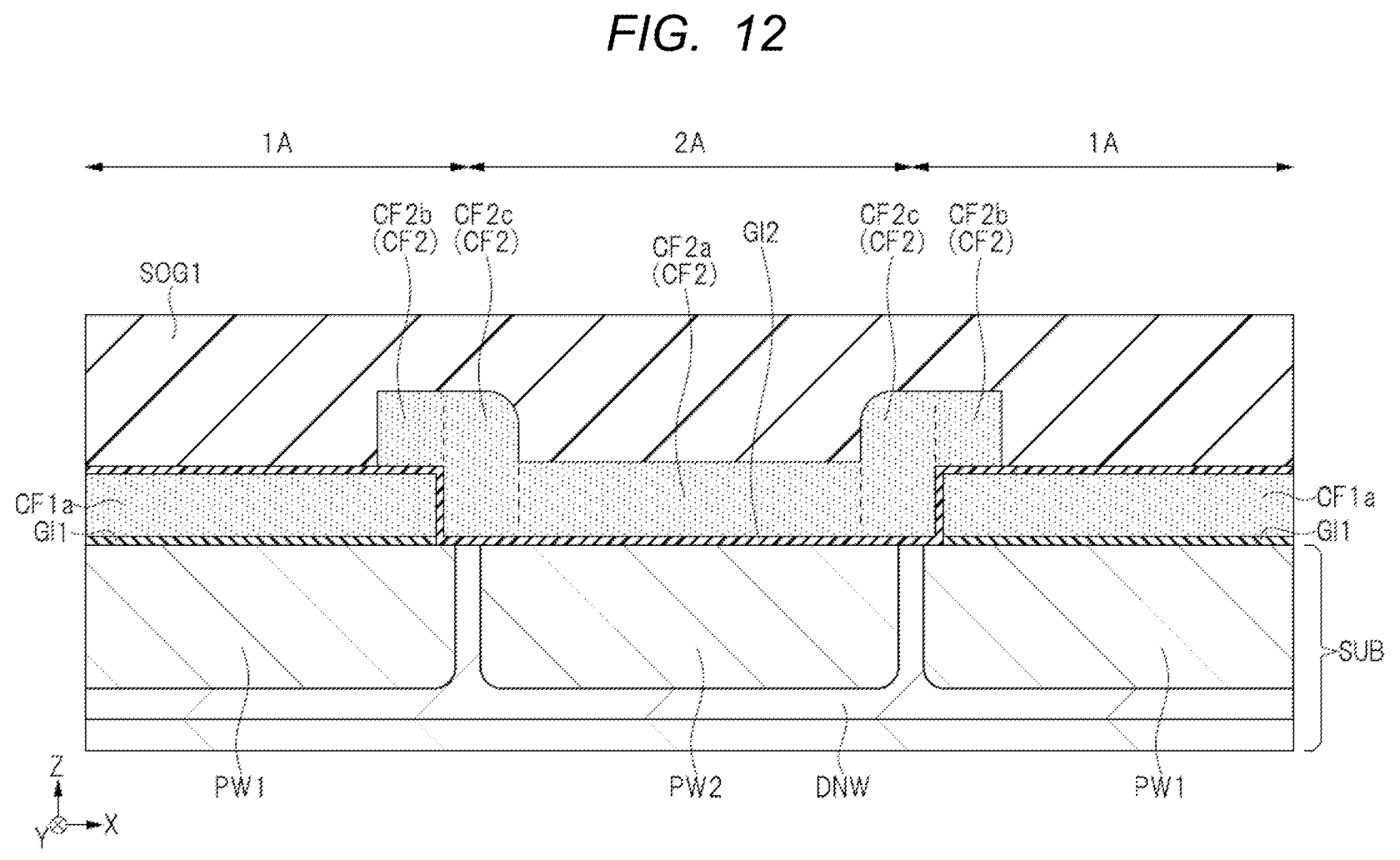

FIG. 12 shows the manufacturing process subsequent to FIG. 6. As shown in FIG. 12, the coating film SOG1 is formed by a coating method so as to cover the conductive pattern CF1a and the conductive film CF2. The coating film SOG1 is, for example, a resist film or a silicon oxide film.

Figure 13:
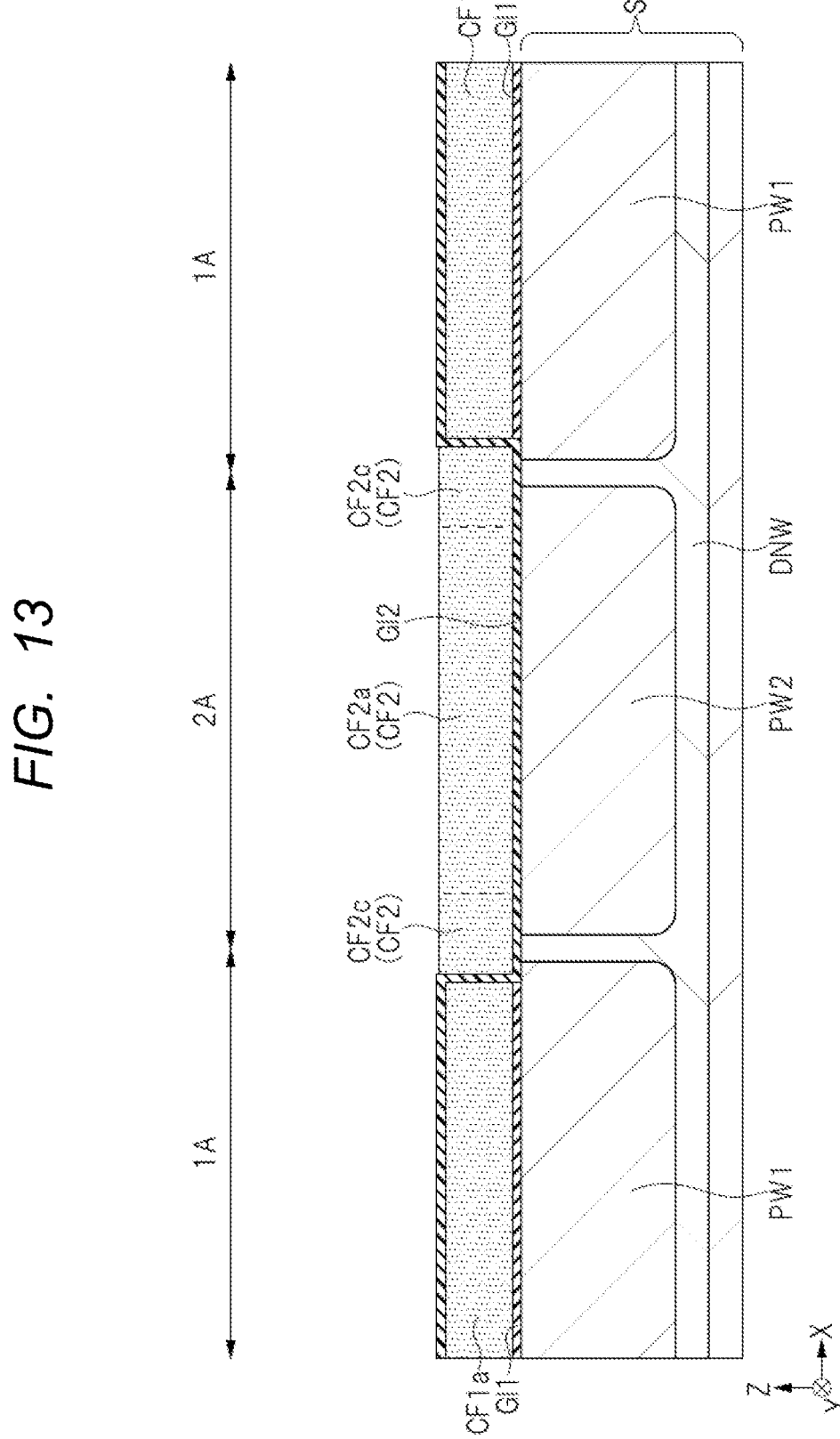
FIG. 13 is a cross-sectional view showing a manufacturing process of the semiconductor device following FIG. 12.

As shown in FIG. 13, a non-selective anisotropic etching treatment is performed to the coating film SOG1 and the conductive film CF2. Thus, the coating film SOG1, the second portion CF2b, and a part of the third portion CF2c formed at a location higher than the upper surface of the first portion CF2a are selectively removed. Subsequent manufacturing processes are the same as those in FIGS. 9 to 11.

In the second embodiment, similarly to the first embodiment, the height of the conductive film CF1 (conductive pattern CF1a) and the height of the conductive film CF2 can be aligned.

Second Examined Example

Figure 27:
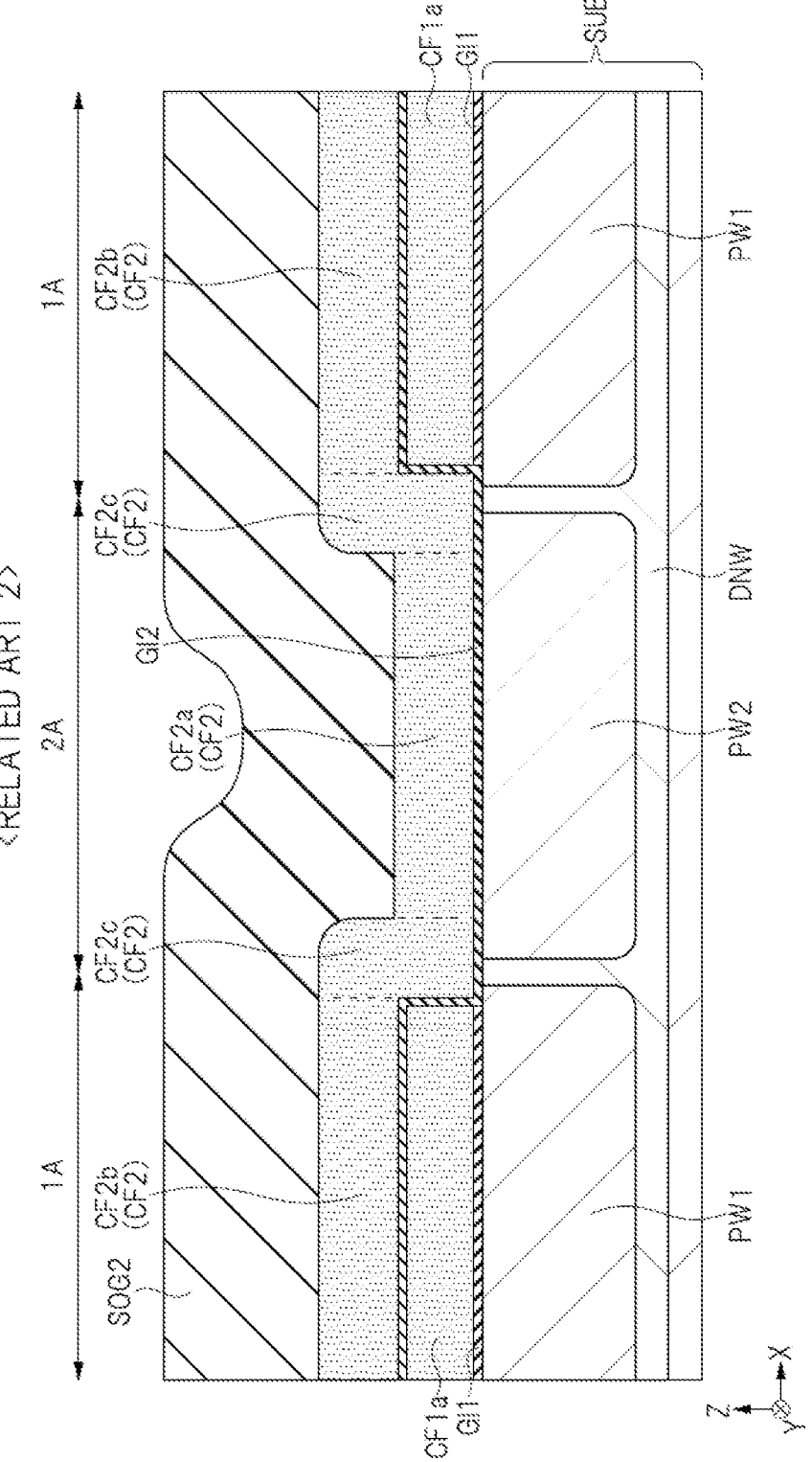
FIG. 27 is a cross-sectional view showing a manufacturing process of a semiconductor device in a second examined example.
Figure 28:
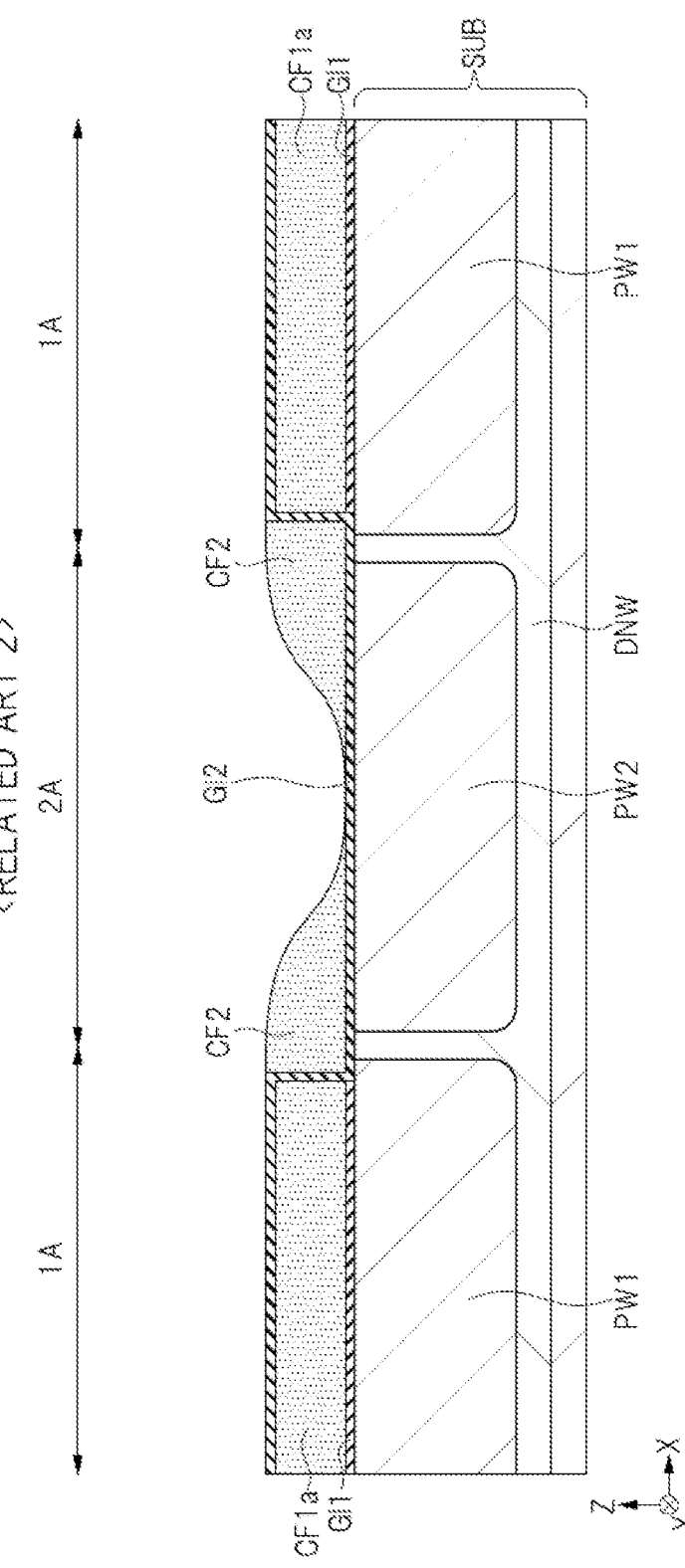
FIG. 28 is a cross-sectional view showing a manufacturing process of the semiconductor device following FIG. 27.

FIG. 27 and FIG. 28 show the manufacturing method of the semiconductor device of the second examined example studied by the present inventors. In FIG. 27, after the manufacturing process of the conductive film CF2 of FIG. 5, in order to eliminate the step between the upper surface of the second portion CF2b and the upper surface of the first portion CF2a, the coating film SOG2 covering the conductive film CF2 is formed. At this time, in the X-direction, the width of the first portion CF2a may be as large as 10 μm or more. In such case, it is difficult to make the upper surface of the coating film SOG2 located over the first portion CF2a flat.

The inventors of the present application have found that, when the non-selective anisotropic etching treatment is performed to the coating film SOG2 and the conductive film CF2 in such a condition, as shown in FIG. 28, there is a possibility that a part of the first portion CF2a disappears.

In the second embodiment, since the second portion CF2b is patterned in FIG. 6, the width of the second portion CF2b and the width of the third portion CF2c are smaller than the width of the second portion CF2b and the width of the third portion CF2c in the examined example. Therefore, as shown in FIG. 12, the upper surface of the coating film SOG1 becomes flat, and the problem of the second examined example is solved.

With reference to FIG. 8, an exemplary requirement in which the upper surface of the coating film SOG1 can be maintained flat will be described.

The first requirement is that, in the direction (X-direction) perpendicular to the side surface of the conductive pattern CF1a, the sum Cn of the width of the second portion CF2b and the width of the third portion CF2c is less than 2 μm. The second requirement is that the width Dn of the first portion CF2a is less than 2 μm in the X-direction. The third requirement is that, in the X-direction, the width En of the conductive film CF1 not covered with the second portion CF2b is less than 2 μm. Note that "n" is an integral number.

It is preferable that any of these requirements is satisfied. Thus, the upper surface of the coating film SOG1 can be maintained flat in FIG. 12.

Third Embodiment

The manufacturing method of the semiconductor device in the third embodiment will be described below with reference to FIGS. 14 to 16. Note that, in the following description, differences from the first embodiment and the second embodiment will be mainly described, and description of overlapping points with the first embodiment and the second embodiment will be omitted.

In the third embodiment, the coating film SOG1 and the anisotropic etching treatment are used as in the second embodiment, but an anisotropic etching treatment having a selectivity is used.

Figure 14:
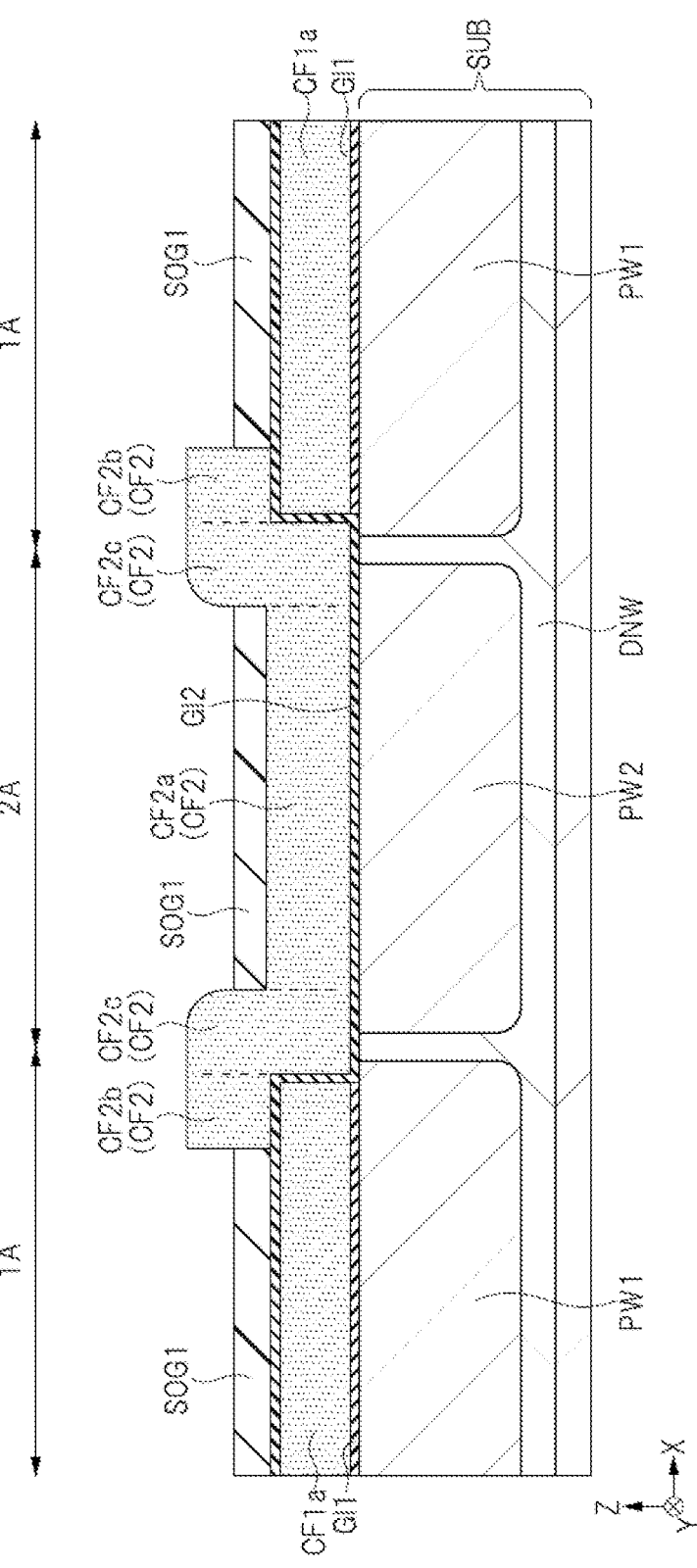
FIG. 14 is a cross-sectional view showing a manufacturing process of a semiconductor device in a third embodiment.

FIG. 14 shows the manufacturing process subsequent to FIG. 12. As shown in FIG. 14, after the coating film SOG1 is formed in FIG. 12, the anisotropic etching treatment is performed under the condition that the coating film SOG1 is more easily etched than the conductive film CF2. Thus, the coating film SOG1 is thinned, and the second portion CF2b and the third portion CF2c are exposed from the coating film SOG1.

Figure 15:
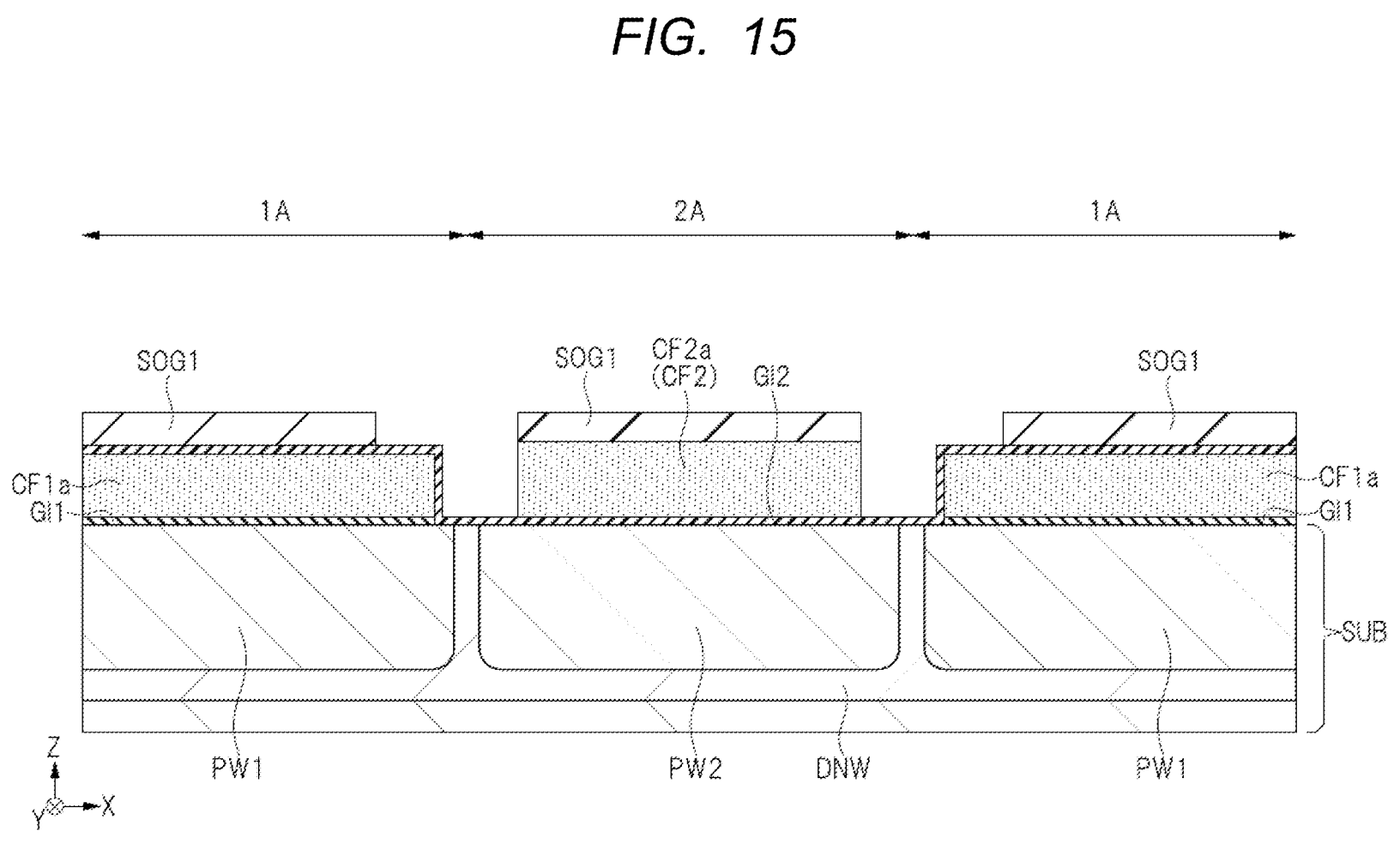

As shown in FIG. 15, the anisotropic etching treatment is performed under the condition that the conductive film CF2 is more easily etched than the coating film SOG1. Thus, the second portion CF2b and the third portion CF2c are removed.

Figure 16:
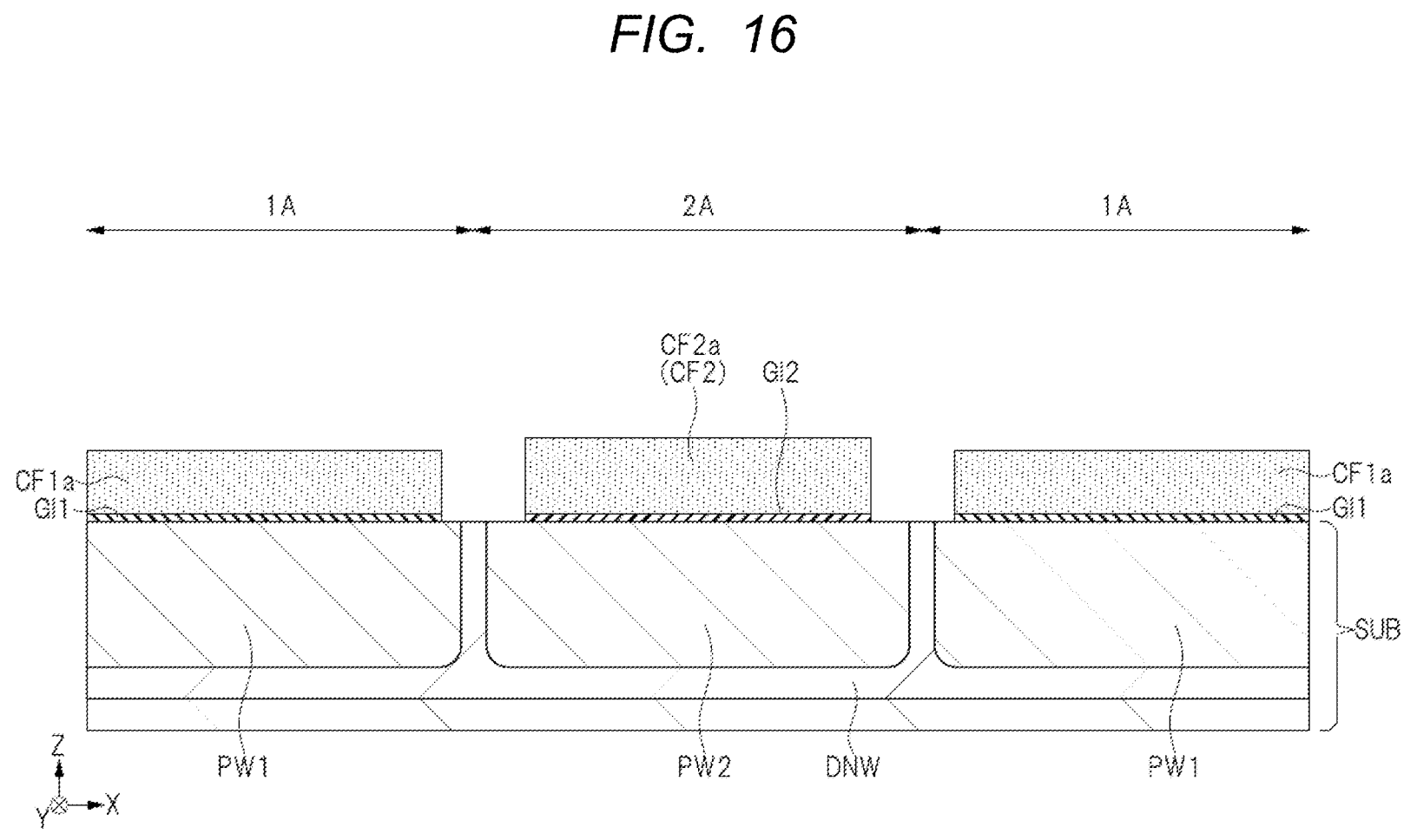

As shown in FIG. 16, first, the anisotropic etching treatment is performed under the condition that the coating film SOG1 is more easily etched than the conductive film CF2. Thus, the coating film SOG1 is removed.

Next, the gate dielectric film GI2 located on the side surface of the conductive pattern CF1a and on the upper surface of the conductive pattern CF1a is removed by an isotropic etching treatment. In this isotropic etching treatment, for example, an aqueous solution containing hydrofluoric acid is used. Thereafter, although not shown, n-type impurities are introduced into the conductive pattern CF1a and the conductive film CF2 by the photolithography technique and the ion-implantation method. Subsequent manufacturing steps are the same as those in FIGS. 10 to 11.

In the third embodiment, as in the first embodiment and the second embodiment, the height of the conductive film CF1 (conductive pattern CF1a) and the height of the conductive film CF2 can be aligned.

In the second embodiment, a non-selective anisotropic etching treatment is performed to the coating film SOG1 and the conductive film CF2. However, when the etching rates of the coating film SOG1 and the conductive film CF2 are not completely the same, unevenness may occur at the upper surface of the conductive film CF2. Further, as shown in FIG. 13, in this anisotropic etching treatment, the etching needs to be controlled so that the upper part of the third portion CF2c and the second portion CF2b can be completely removed. At the same time, the etching needs to be controlled so that the lower part of the third portion CF2c and the first portion CF2a that are left are not too thin. Such etching control makes it difficult to maintain uniformity in the thickness of each of the lower part of the third portion CF2c and the first portion CF2a left in the wafer surface.

In the third embodiment, since the coating film SOG1 and the conductive film CF2 are selectively etched alternately, there is no possibility that unevennesses occur at the upper surface of the conductive film CF2. Therefore, it is easy to maintain the uniformity of the thickness of each of the lower part of the third portion CF2c and the first portion CF2a left in the wafer surface.

Further, the upper surface of the coating film SOG1 can be maintained flat in the same manner as in the second embodiment. However, the coating film SOG1 may be left thin to such an extent that the second portion CF2b and the third portion CF2c are exposed in FIG. 14, so that the flatness of the upper surface of the coating film SOG1 in FIG. 12 may be lower than the flatness of the upper surface of the coating film SOG1 in the second embodiment. The requirements in FIG. 8 may be relaxed to some extent, and the thickness of the coating film SOG1 in FIG. 12 may be smaller than the thickness of the coating film SOG1 in the second embodiment.

Further, in the third embodiment, as shown in FIG. 15, since all of the third portion CF2c can be removed, the gate dielectric film GI2 located on the side surface of the conductive pattern CF1a covered by the third portion CF2c is exposed. Thus, the isotropic etching treatment of FIG. 16 makes it easier to remove the gate dielectric film GI2 located on the side surface of the conductive pattern CF1a than the first embodiment and the second embodiment.

That is, in the first embodiment and the second embodiment, as shown in FIGS. 7 and 9, when the gate dielectric film GI2 located on the side surface of the conductive pattern CF1a is isotropically etched, the thickness of the gate dielectric film GI2 in the Z-direction needs to be etched. Specifically, the isotropic etching treatment is performed on the thickness of the gate dielectric film GI2 (for example, 80 nm or more and 120 nm or less) corresponding to the thickness of the conductive pattern CF1a. Therefore, the etching period needs to be longer than when the isotropic etching treatment is performed on the thickness of the gate dielectric film GI2 (for example, 2 nm or more and 6 nm or less) at the time of film formation.

In order to completely remove the gate dielectric film GI2 located on the side surface of the conductive pattern CF1a, some overetching is performed in the isotropic etching treatment. In this case, in consideration of the variation in the etching in the wafer surface, it is necessary to increase the time of the overetching as the etching time becomes longer. As a result, the etching of the gate dielectric film GI2 located under the third portion CF2c may excessively proceed, and the etching may proceed also in the gate dielectric film GI2 located under the first portion CF2a. In other words, a part of the gate dielectric film GI2 located under the gate electrode GE2 may disappear.

In the third embodiment, since the gate dielectric film GI2 located on the side surface of the conductive pattern CF1a is exposed, the isotropic etching treatment may be performed on the thickness of the gate dielectric film GI2 (for example, 2 nm or more and 6 nm or less) at the time of film formation. Therefore, the gate dielectric film GI2 can be easily removed with shorter etching times than the first embodiment and the second embodiment.

First Modified Example

After the manufacturing process of FIG. 16, the gate electrode GE1 and the gate electrode GE2 are patterned as shown in FIG. 10. At this time, the semiconductor substrate SUB existing under the third portion CF2c and under the gate dielectric film GI2 located on the side surface of the conductive pattern CF1a is also etched. That is, a trench is formed in the semiconductor substrate SUB existing under the third portion CF2c and under the gate dielectric film GI2 located on the side surface of the conductive pattern CF1a. The silicon oxide film and the silicon nitride film may be buried in the trench when the sidewall spacer SW is formed, or a foreign body may be left in the trench, so that there is a possibility that a defect caused by trench may occur.

Figure 17:
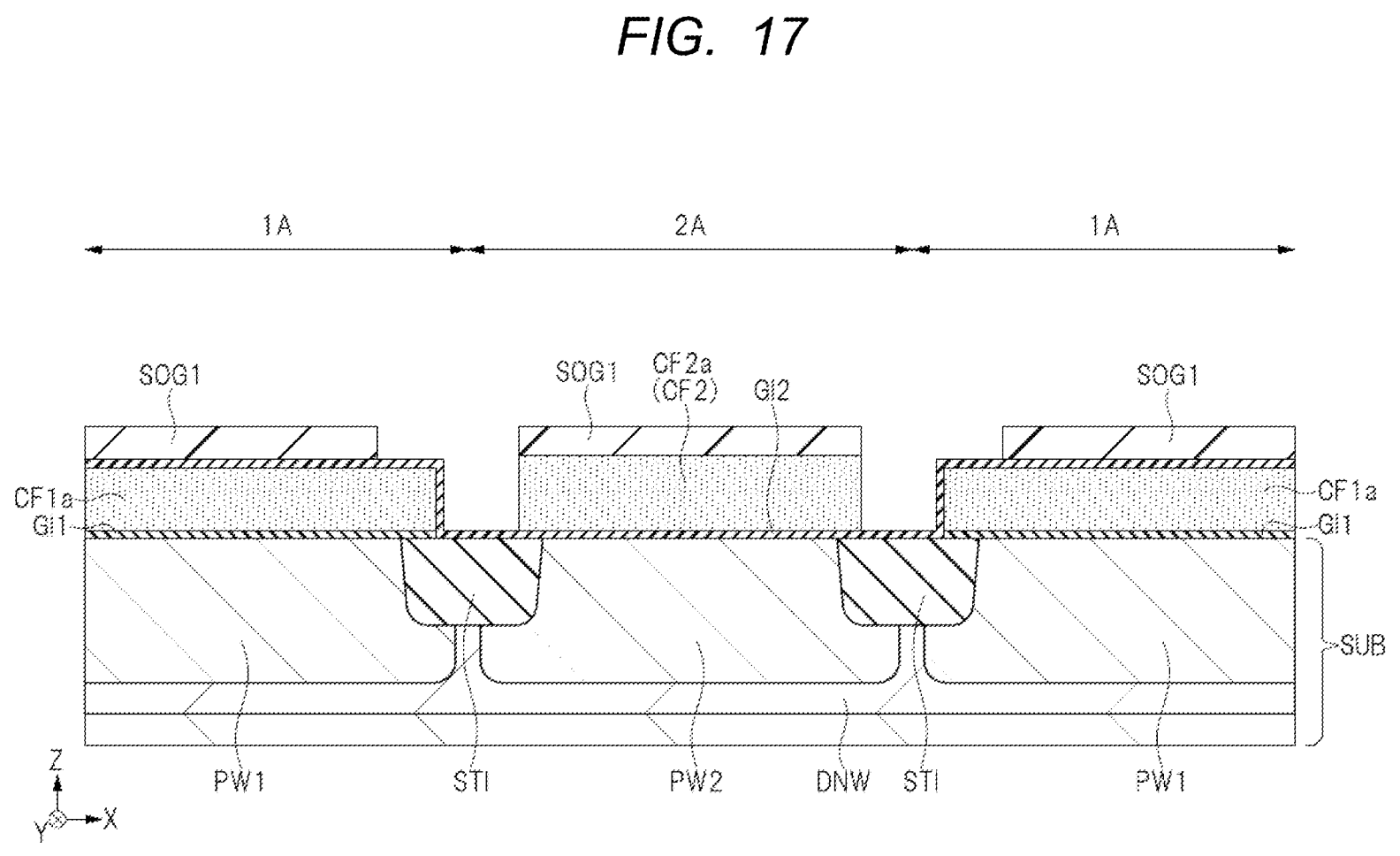

As shown in FIG. 17, in the first modified example, the element isolation portion STI is formed in the semiconductor substrate SUB, and at least the third portion CF2c and the gate dielectric film GI2 located on the side surface of the conductive pattern CF1a are located on the element isolation portion STI. The element isolation portion STI includes a trench formed in the semiconductor substrate SUB and a dielectric film buried in the trench.

The element isolation portion STI can be formed at the stage of FIG. 1. First, a silicon nitride film, for example, is formed on the semiconductor substrate SUB by a film formation treatment using, for example, a CVD method. Next, the silicon nitride film is patterned to form a hard mask. Next, an anisotropic etching treatment is performed using the hard mask as a mask to form the trench in the semiconductor substrate SUB exposed from the hard mask. Next, a dielectric film such as a silicon oxide film is formed on the hard mask by a film formation treatment using, for example, a CVD method so as to fill the trench. Next, the dielectric film located outside the trench is removed by a polishing treatment using a CMP method. Next, the hard mask is removed by an isotropic etching treatment. As described above, in the semiconductor substrate SUB, the element isolation portion STI including the trench and the dielectric film buried in the trench is formed.

In the first embodiment and the second embodiment, as shown in FIG. 9, the semiconductor substrate SUB is exposed at a location where the gate dielectric film GI2 located on the side surface of the conductive pattern CF1a is removed. However, the width of the location is equal to the thickness of the gate dielectric film GI2, and is, for example, 2 nm or more and 6 nm or less. Therefore, when the gate electrode GE1 and the gate electrode GE2 are patterned, it is difficult for the etching gas to enter the above-described location, and the etching to the semiconductor substrate SUB hardly proceeds. However, in the first embodiment and the second embodiment, it is preferable that the gate dielectric film GI2 located on the side surface of the conductive pattern CF1a is located on the element isolation portion STI if higher reliability is required.

Second Modified Example

In the second modified example, the thickness of each of the conductive film CF1 and the conductive film CF2 is made thinner than that of the third embodiment, and by adding the conductive film CF3 later, the thickness of each of the gate electrode GE1 and the gate electrode GE2 can be made to be about the same as that of the third embodiment.

Figure 18:
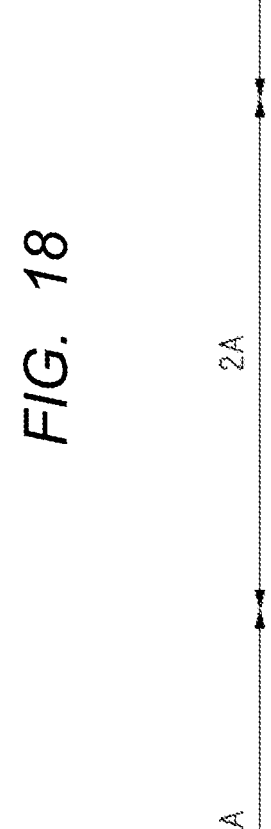
FIG. 18 is a cross-sectional view showing a manufacturing process of a semiconductor device in a second modified example of the third embodiment.

FIG. 18 is a manufacturing process corresponding to FIG. 12, and shows a manufacturing process of the coating film SOG1 covering the conductive pattern CF1a and the conductive film CF2. In FIG. 18, the thickness of each of the conductive film CF1 and the conductive film CF2 is, for example, 40 nm or more and 60 nm or less.

Since the thickness of the conductive film CF2 is smaller than the thickness of the conductive film CF2 of the third embodiment, the thickness of each of the second portion CF2b and the third portion CF2c is also smaller than the thickness of each of the second portion CF2b and the third portion CF2c of the third embodiment. Therefore, the level difference occurring between upper surface of the second portion CF2b and upper surface of the first portion CF2a is low. Therefore, the flatness of the coating film SOG1 in upper surface is more easily enhanced than the flatness of the coating film SOG1 in the third embodiment.

Figure 19:
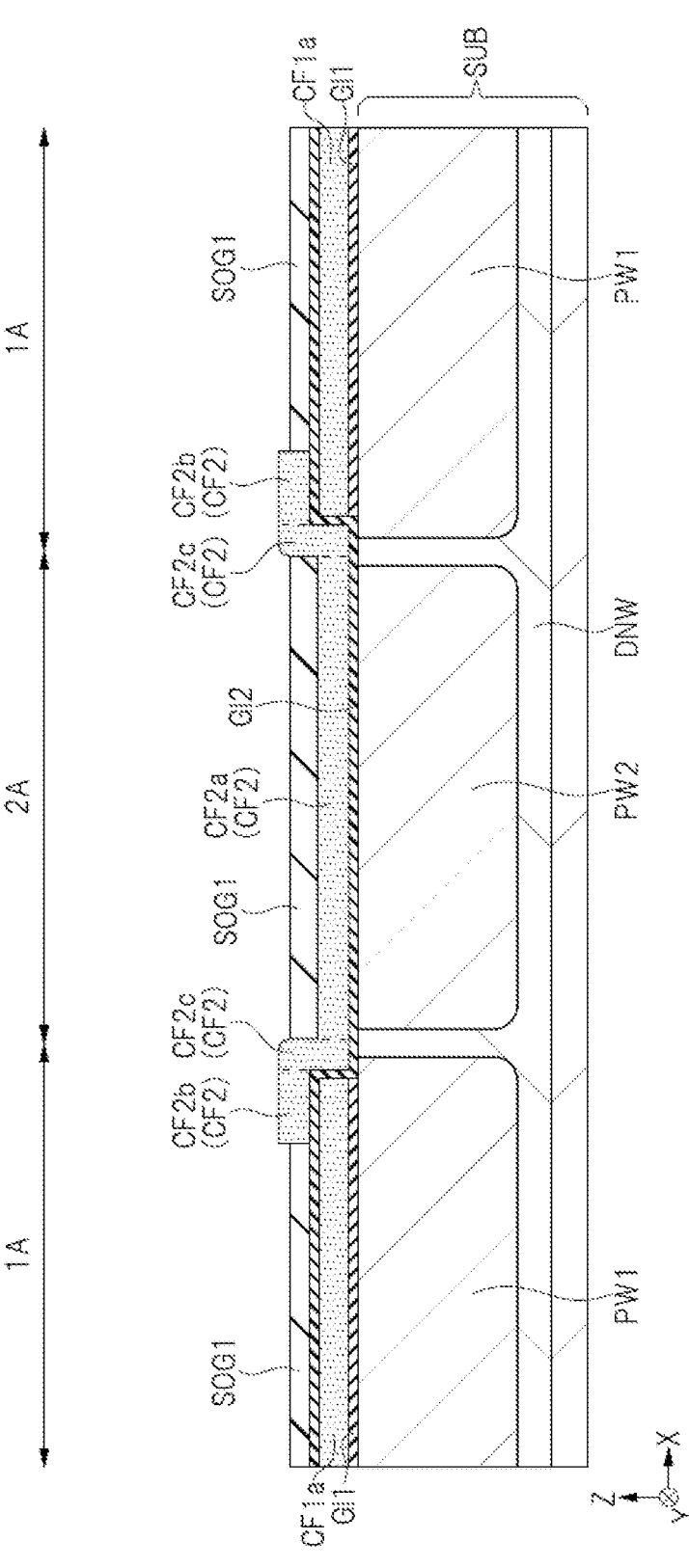
FIG. 19 is a cross-sectional view showing a manufacturing process of the semiconductor device following FIG. 18.

As shown in FIG. 19, an anisotropic etching treatment is performed under the condition that the coating film SOG1 is more easily etched than the conductive film CF2. Thus, the coating film SOG1 is thinned, and the second portion CF2b and the third portion CF2c are exposed from the coating film SOG1.

Figure 20:
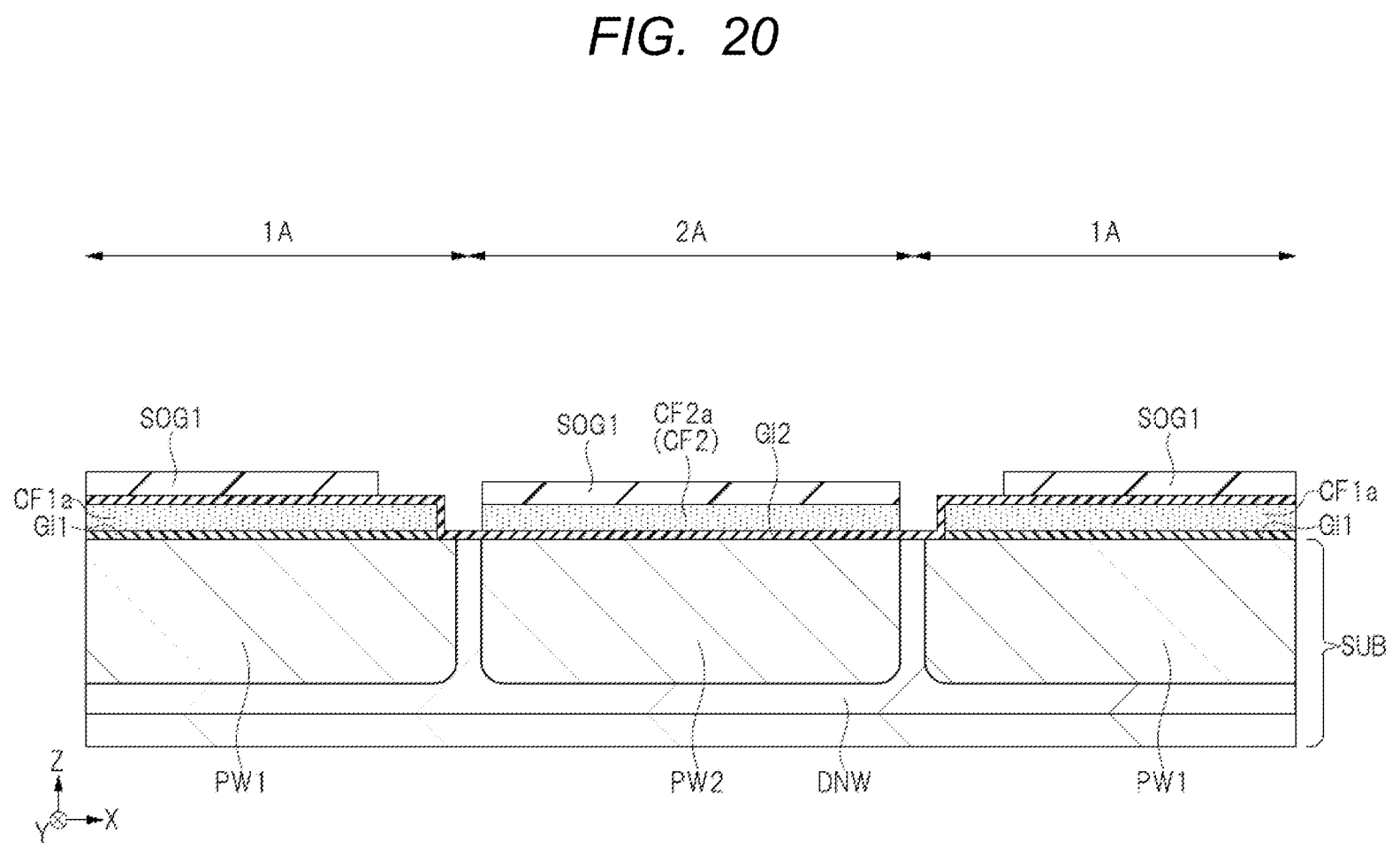

As shown in FIG. 20, the anisotropic etching treatment is performed under the condition that the conductive film CF2 is more easily etched than the coating film SOG1. Thus, the second portion CF2b and the third portion CF2c are removed. Since the thickness of each of the second portion CF2b and the third portion CF2c is smaller than the thickness of each of the second portion CF2b and the third portion CF2c of the third embodiment, the duration of the anisotropic etching treatment can be shortened.

Figure 21:
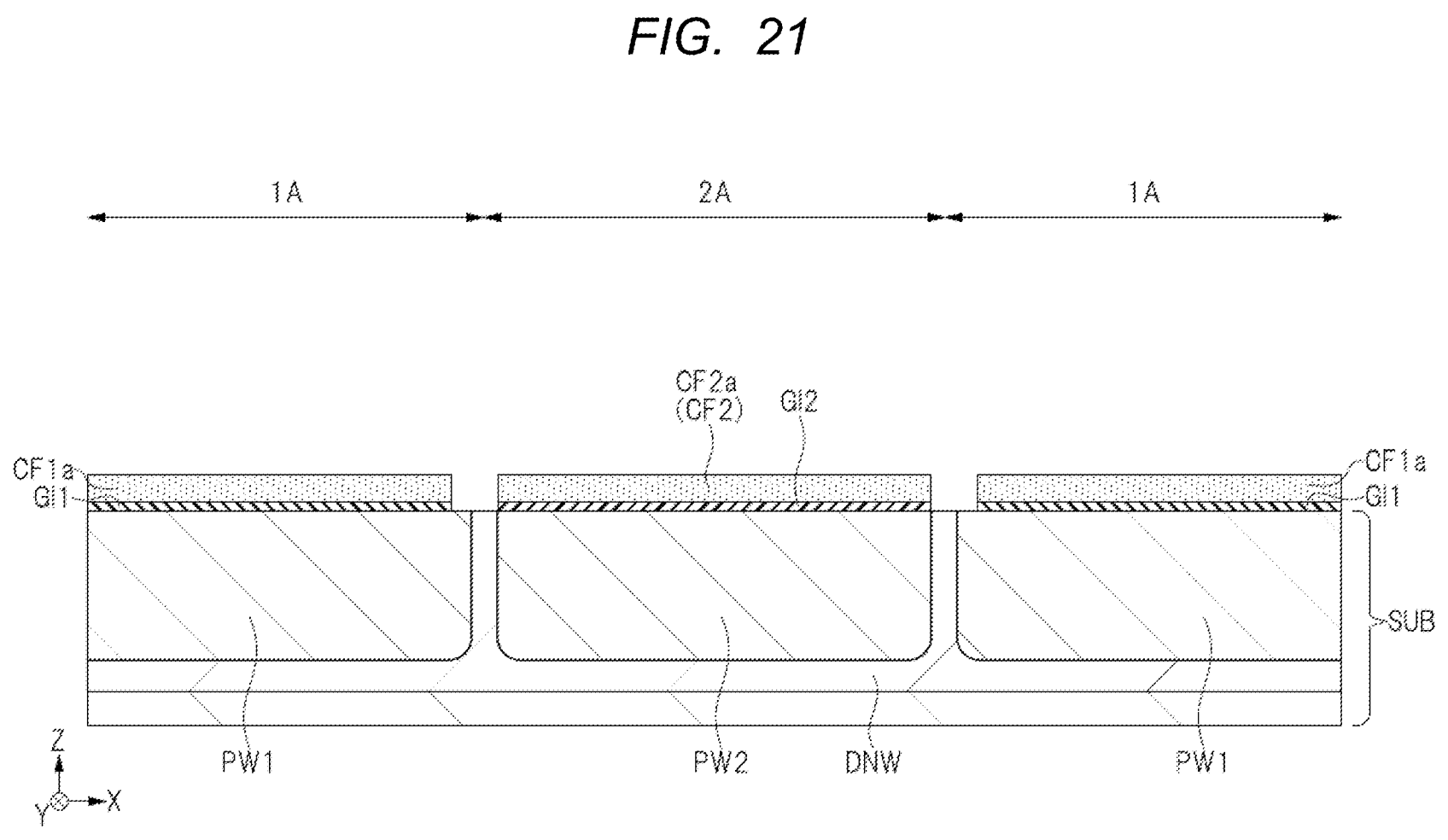

As shown in FIG. 21, first, an anisotropic etching treatment is performed under the condition that the coating film SOG1 is more easily etched than the conductive film CF2. Thus, the coating film SOG1 is removed.

Next, the gate dielectric film GI2 located on the side surface of the conductive pattern CF1a and on upper surface of the conductive pattern CF1a are removed by an isotropic etching treatment. In this isotropic etching treatment, for example, an aqueous solution containing hydrofluoric acid is used. Even in the second modified example, the gate dielectric film GI2 located on the side surface of the conductive pattern CF1a covered by the third portion CF2c is exposed. Therefore, it is easy to remove the gate dielectric film GI2.

Figure 22:
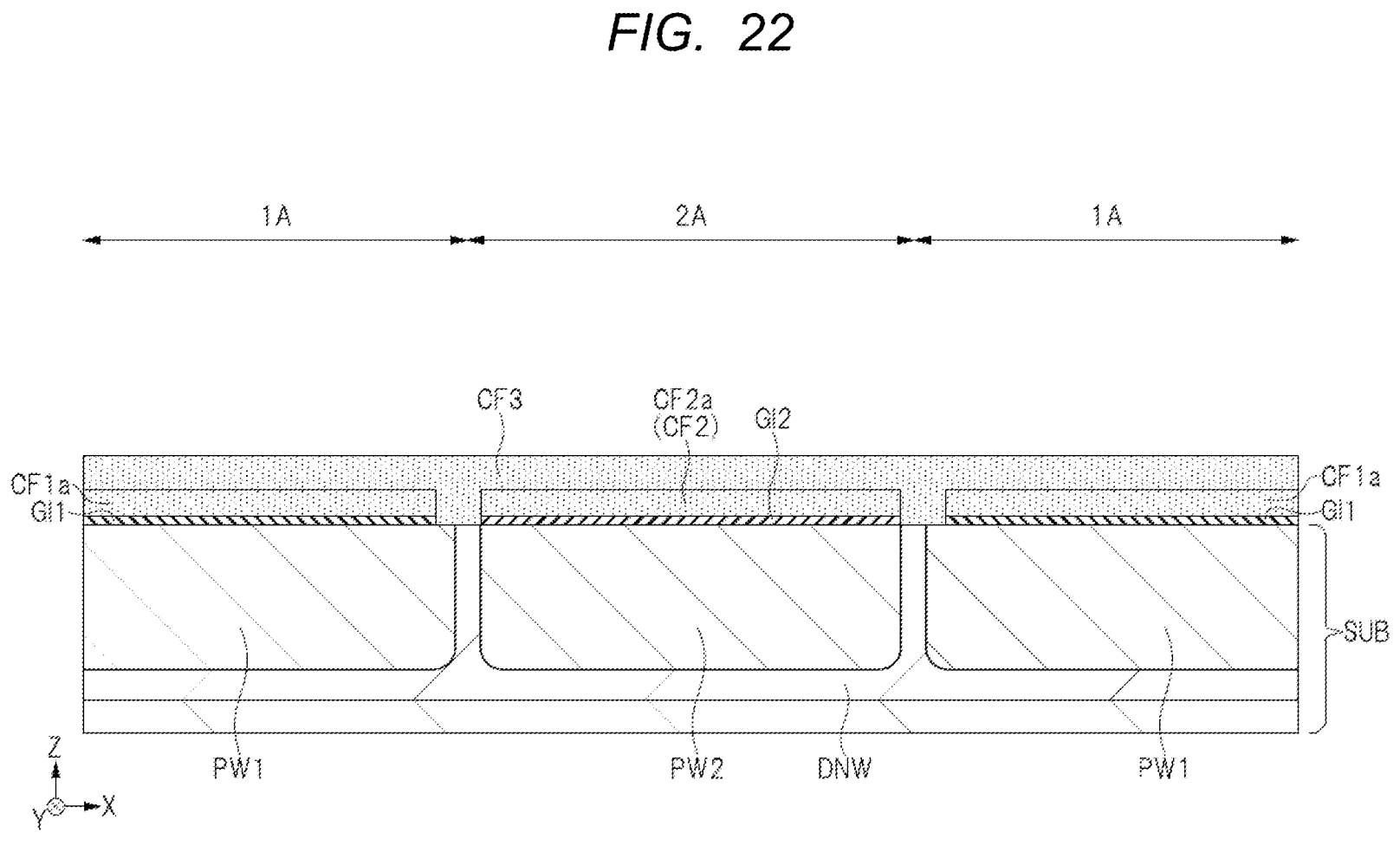

As shown in FIG. 22, the conductive film CF3 is formed by a film formation treatment using, for example, a CVD method so as to cover the conductive pattern CF1a and the conductive film CF2. The conductive film CF3 includes, for example, a polysilicon film. The thickness of the conductive film CF3 is, for example, 40 nm or more and 60 nm or less. The space between the conductive pattern CF1a and the first portion CF2a is buried by the conductive film CF3. Thereafter, although not shown, n-type impurities are introduced into the conductive pattern CF1a, the conductive film CF2, and the conductive film CF3 by the photolithography technique and the ion-implantation method.

Figure 23:
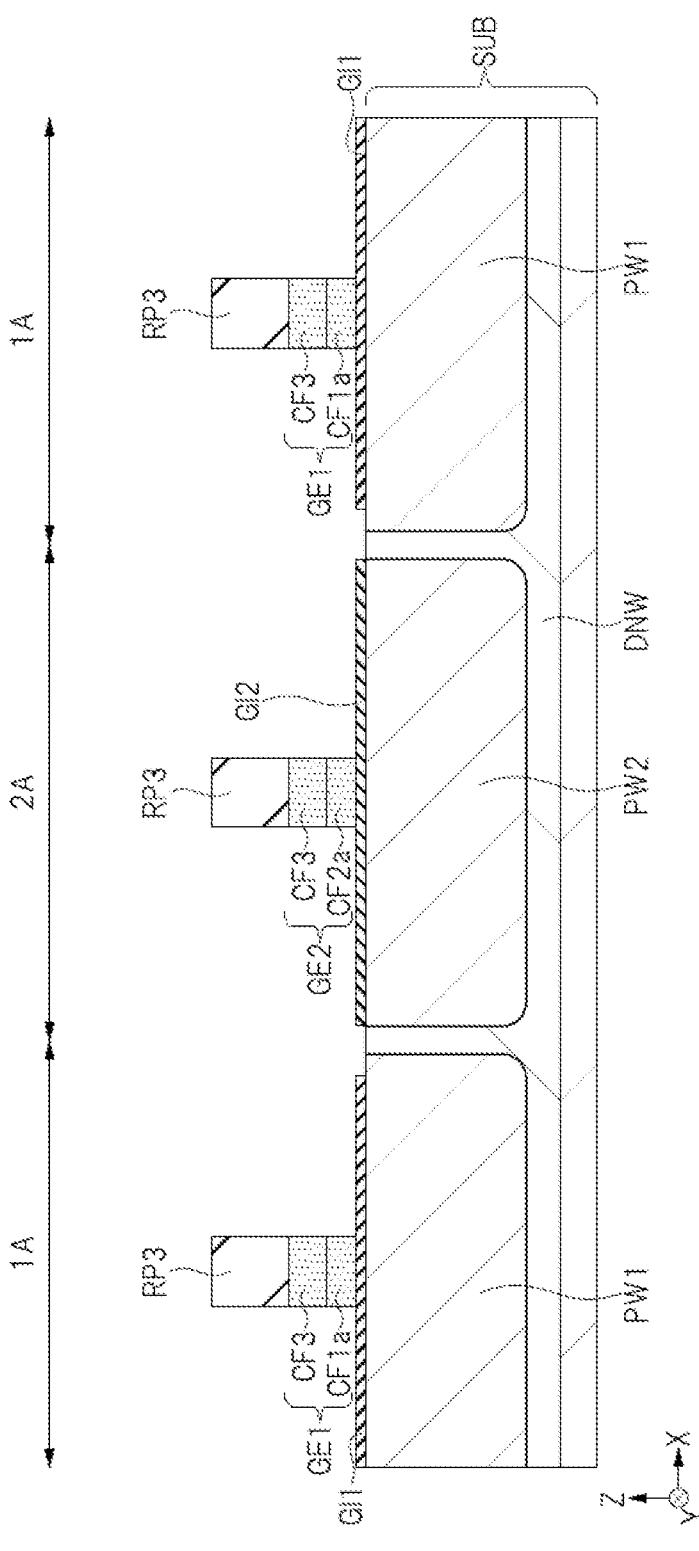
FIG. 23 is a cross-sectional view showing a manufacturing process of the semiconductor device following FIG. 22.

As shown in FIG. 23, by patterning the conductive pattern CF1a, the conductive film CF2, and the conductive film CF3, the gate electrode GE1 is formed from a part of the conductive pattern CF1a and a part of the conductive film CF3, and the gate electrode GE2 is formed from a part of the first place CF2a and a part of the conductive film CF3.

First, the resist pattern RP3 covering a part of the conductive film CF3 is formed. The resist pattern RP3 of the second modified example has an opening pattern similar to the resist pattern RP3 of FIG. 10. Next, an anisotropic etching treatment is performed using the resist pattern RP3 as a mask to selectively remove the conductive pattern CF1a, the first portion CF2a, and the conductive film CF3 exposed from the resist pattern RP3. A portion of the remaining conductive pattern CF1a and a portion of the conductive film CF3 are formed as the gate electrode GE1, and a portion of the remaining conductive film CF2 and a portion of the conductive film CF3 are formed as the gate electrode GE2. Thereafter, the resist pattern RP3 is removed by ashing. Subsequent manufacturing steps are the same as in FIG. 11.

Also in the second modified example, the element isolation portion STI of the first modified example may be formed. The position of the element isolation portion STI needs to be set mainly in accordance with a portion where the third portion CF2c is formed. However, the larger the thickness of the conductive film CF2, the more difficult it is to align the element isolation portion STI with the third portion CF2c. Here, as compared with FIG. 14, the thickness of the conductive film CF2 is smaller in FIG. 19, and thus the third portion CF2c in the X-direction is also smaller. Therefore, in the second modified example, the alignment between the element isolation portion STI and the third portion CF2c is facilitated.

As shown in FIG. 22, when the conductive film CF3 is formed, the space between the conductive pattern CF1a and the first portion CF2a is buried by the conductive film CF3. In other words, the conductive film CF3 covers the semiconductor substrate SUB existing under the third portion CF2c and under the gate dielectric film GI2 located on the side surface of the conductive pattern CF1a.

In this situation, since the patterning of FIG. 23 is performed, the semiconductor substrate SUB existing under the third portion CF2c and under the gate dielectric film GI2 located on the side surface of the conductive pattern CF1a is hardly etched. Therefore, it is difficult to form a trench that causes a defect in the semiconductor substrate SUB. Therefore, even if the element isolation portion STI is not formed, the patterning of FIG. 23 can be satisfactorily performed. However, if higher reliability is required, it is preferable that the third portion CF2c and the gate dielectric film GI2 located on the side surface of the conductive pattern CF1a are also located on the element isolation portion STI in the second modified example.

Application Example of Second Modified Example

The technical idea of reducing the thickness of each of the conductive film CF1 and the conductive film CF2 and adding the conductive film CF3 later in the second modified example can also be applied to the first embodiment and the second embodiment.

Figure 24:
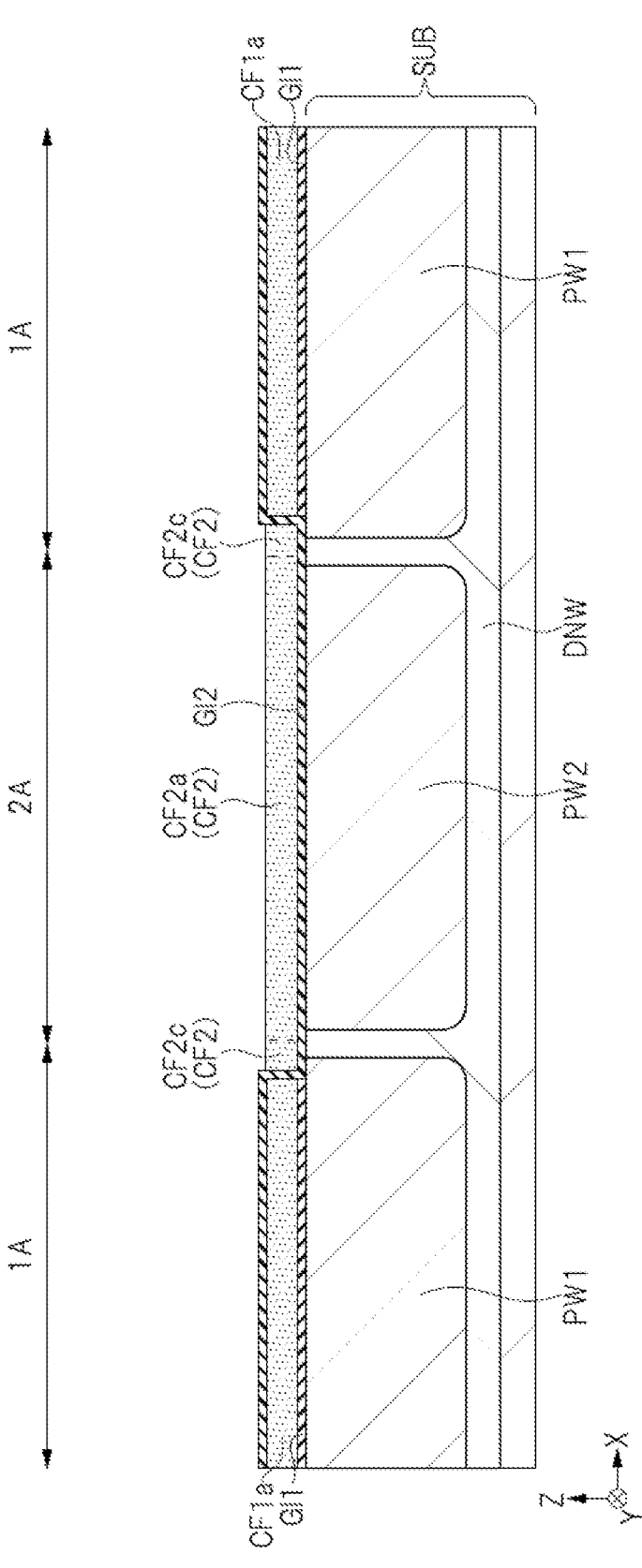
FIG. 24 is a cross-sectional view showing a manufacturing process of a semiconductor device in an application example in which the technical idea of the second modified example is applied to the first embodiment and the second embodiment.
Figure 25:
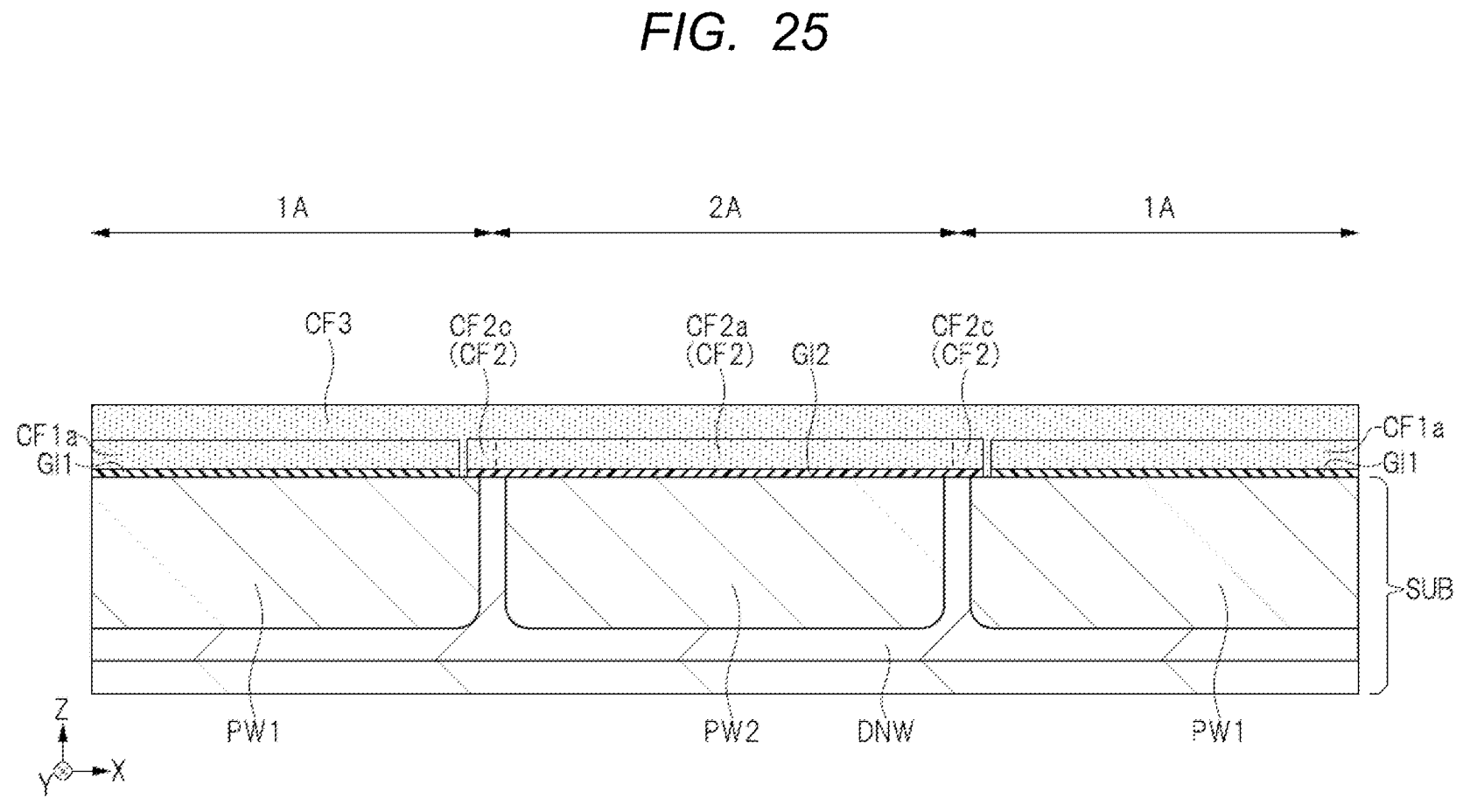

FIG. 24 shows the state after the manufacturing process corresponding to FIG. 7 of the first embodiment and FIG. 13 of the second embodiment. Thereafter, as shown in FIG. 25, an isotropic etching treatment is performed to remove the gate dielectric film GI2 located on the side surface of the conductive pattern CF1a and the gate dielectric film GI2 located on the upper surface of the conductive pattern CF1a. Next, the conductive film CF3 is formed, and the conductive pattern CF1a, the conductive film CF2, and the conductive film CF3 are patterned to form the gate electrode GE1 and the gate electrode GE2.

As described above, in the first embodiment and the second embodiment, when the gate dielectric film GI2 located on the side surface of the conductive pattern CF1a is isotropically etched, the thickness of the gate dielectric film GI2 in the Z-direction needs to be etched, and therefore, the etching times need to be longer than the second modified example. However, the smaller the thickness of the conductive pattern CF1a, the shorter the etching times. Therefore, it is possible to suppress the possibility that the gate dielectric film GI2 located under the third portion CF2c is excessively etched.

Further, as shown in FIG. 25, the conductive film CF3 is buried at a location where the gate dielectric film GI2 located on the side surface of the conductive pattern CF1a is removed. That is, the space between the conductive pattern CF1a and the third portion CF2c is filled with the conductive film CF3. Therefore, similarly to the second modified example, even if the element isolation portion STI is not formed, patterning for forming the gate electrode GE1 and the gate electrode GE2 can be satisfactorily performed.

Although the present invention has been described in detail based on embodiments, the present invention is not limited to the above-described embodiments, and various modifications can be made without departing from the gist of the present invention.

What is claimed is:

1. A method of manufacturing a semiconductor device, the method comprising:

(a) forming a first gate dielectric film on a semiconductor substrate;

(b) after the (a), forming a first conductive film on the first gate dielectric film;

(c) after the (b), patterning the first conductive film to form a first conductive pattern;

(d) after the (c), removing the first gate dielectric film exposed from the first conductive pattern;

(e) after the (d), forming a second gate dielectric film on the semiconductor substrate, on a side surface of the first conductive pattern, and on an upper surface of the first conductive pattern;

(f) after the (e), forming a second conductive film on the second gate dielectric film, the second conductive film comprising:

a first portion located on the semiconductor substrate;

a second portion located on the upper surface of the first conductive pattern; and a third portion connecting the first portion and the second portion so as to cover the side surface of the first conductive pattern, an upper surface of the third portion being higher than an upper surface of the first portion,

(g) after the (f), patterning the second portion such that the first portion, the third portion and a part of the second portion are left;

(h) after the (g), selectively removing the second portion and a part of the third portion, the part of the third portion being formed at a location higher than the upper surface of the first portion;

(i) after the (h), removing the second gate dielectric film located on the side surface of the first conductive pattern and the second gate dielectric film located on the upper surface of the first conductive pattern; and (j) after the (i), patterning the first conductive pattern and the second conductive film to form a first gate electrode from a part of the first conductive pattern and to form a second gate electrode from a part of the first portion.

2. The method according to claim 1,
wherein in the (h), the second portion and the part of the third portion are selectively removed by a polishing treatment using a CMP method.

3. The method according to claim 2,
wherein the first conductive pattern comprises a plurality of first conductive patterns,
wherein in the (f), the second conductive film is formed so as to cover the plurality of first conductive patterns,
wherein the first portion comprises a plurality of first portions, the second portion comprises a plurality of second portions, and the third portion comprises a plurality of third portions,
wherein at the end of the (g), a sum of plane areas of the plurality of second portions and plane areas of the plurality of third portions is less than 50% of a sum of plane areas of the plurality of first conductive patterns, plane areas of the plurality of first portions and the plane areas of the plurality of third portions, and
wherein at the end of the (g), in a direction perpendicular to the side surface of the first conductive pattern, a sum of a width of the second portion and a width of the third portion is less than 2 µm.

4. The method according to claim 2,
wherein at the end of the (g), in a direction perpendicular to the side surface of the first conductive pattern, a width of the first portion is greater than 10 µm.

5. The method according to claim 2, comprising:
(k) between the (i) and the (j), forming a third conductive film so as to cover the first conductive pattern and the second conductive film,
wherein in the (k), a space between the first conductive pattern and the first portion is filled with the third conductive film, and
wherein in the (j), the first conductive pattern, the second conductive film and the third conductive film are patterned to form the first gate electrode from the part of the first conductive pattern and a part of the third conductive film and to form the second gate electrode from the part of the first portion and an another part of the third conductive film.

6. The method according to claim 5,
wherein a thickness of each of the first conductive film, the second conductive film and the third conductive film is 40 nm or more and 60 nm or less.

7. The method according to claim 1,
wherein the (h) comprises:
(h1) forming a coating film so as to cover the first conductive pattern and the second conductive film; and
(h2) after the (h1), performing an anisotropic etching treatment to the coating film and the second conductive film to selectively remove the coating film, the second portion and the part of the third portion formed at the location higher than the upper surface of the first portion.

8. The method according to claim 7,
wherein at the end of the (g), in a direction perpendicular to the side surface of the first conductive pattern, a sum of a width of the second portion and a width of the third portion is less than 2 µm, or a width of the first portion is less than 2 µm, or a width of the first conductive pattern not covered with the second portion is less than 2 µm.

9. The method according to claim 7,
(k) between the (i) and the (j), forming a third conductive film so as to cover the first conductive pattern and the second conductive film,
wherein in the (k), a space between the first conductive pattern and the first portion is filled with the third conductive film, and
wherein in the (j), the first conductive pattern, the second conductive film and the third conductive film are patterned to form the first gate electrode from the part of the first conductive pattern and a part of the third conductive film and to form the second gate electrode from the part of the first portion and an another part of the third conductive film.

10. The method according to claim 9,
wherein a thickness of each of the first conductive film, the second conductive film and the third conductive film is 40 nm or more and 60 nm or less.

11. The method according to claim 1,
wherein the (h) comprises:
(h3) forming a coating film so as to cover the first conductive pattern and the second conductive film;
(h4) after the (h3), performing an anisotropic etching treatment under a condition that the coating film is more easily etched than the second conductive film to thin the coating film and to expose the second portion and the third portion from the coating film;
(h5) after the (h4), performing an anisotropic etching treatment under a condition that the second conductive film is more easily etched than the coating film to remove the second portion and the third portion; and
(h6) after the (h5), performing an anisotropic etching treatment under a condition that the coating film is more easily etched than the second conductive film to remove the coating film.

12. The method according to claim 11,
wherein at the end of the (g), in a direction perpendicular to the side surface of the first conductive pattern, a sum of a width of the second portion and a width of the third portion is less than 2 µm, or a width of the first portion is less than 2 µm, or a width of the first conductive pattern not covered with the second portion is less than 2 µm.

13. The method according to claim 11,
wherein after the (h5), the second gate dielectric film located on the side surface of the first conductive pattern is exposed.

14. The method according to claim 11, comprising:
(l) before the (a), forming an element isolation portion in the semiconductor substrate, the element isolation portion including:
a trench; and
a dielectric film buried in the trench, wherein the second gate dielectric film located on the side surface of the first conductive pattern and the third portion are located on the element isolation portion.

15. The method according to claim 11, (k) between the (i) and the (j), forming a third conductive film so as to cover the first conductive pattern and the second conductive film, wherein in the (k), a space between the first conductive pattern and the first portion is filled with the third conductive film, and wherein in the (j), the first conductive pattern, the second conductive film and the third conductive film are patterned to form the first gate electrode from the part of the first conductive pattern and a part of the third conductive film and to form the second gate electrode from the part of the first portion and an another part of the third conductive film.

16. The method according to claim 15, wherein a thickness of each of the first conductive film, the second conductive film and the third conductive film is 40 nm or more and 60 nm or less.

17. The method according to claim 1, wherein a thickness of each of the first conductive film and the second conductive film is 80 nm or more and 120 nm or less.

18. The method according to claim 1, wherein the first gate dielectric film includes a silicon oxide film, and wherein the second gate dielectric film includes a high dielectric constant film having a dielectric constant higher than a dielectric constant of a silicon nitride film.

19. The method according to claim 18, wherein the first gate dielectric film and the first gate electrode are parts of a first MOSFET, wherein the second gate dielectric film and the second gate electrode are parts of a second MOSFET, and wherein the first MOSFET is used in a circuit operating faster than the second MOSFET.

20. The method according to claim 19, wherein the second MOSFET is used in a power supply circuit or an SRAM, and wherein the first MOSFET is used in a CPU or an SRAM operating faster than the SRAM in which the second MOSFET is used.

\* \* \* \* \*